United States Patent
Lee et al.

(10) Patent No.: US 9,837,022 B2
(45) Date of Patent: Dec. 5, 2017

(54) NON-QUADRANGULAR DISPLAY

(71) Applicant: SAMSUNG DISPLAY CO., LTD., Yongin, Gyeonggi-Do (KR)

(72) Inventors: Seung-Kyu Lee, Asan-si (KR); Kwang-Min Kim, Seoul (KR); Byoung Sun Kim, Seoul (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 45 days.

(21) Appl. No.: 14/960,945

(22) Filed: Dec. 7, 2015

(65) Prior Publication Data

US 2016/0240141 A1     Aug. 18, 2016

(30) Foreign Application Priority Data

Feb. 12, 2015    (KR) ........................ 10-2015-0021599

(51) Int. Cl.
     *G09G 3/32*          (2016.01)
     *G09G 3/3258*       (2016.01)
     (Continued)

(52) U.S. Cl.
CPC ....... *G09G 3/3258* (2013.01); *G02F 1/13454* (2013.01); *G09G 3/20* (2013.01); *G02F 2201/56* (2013.01); *G09G 2300/0408* (2013.01); *G09G 2300/0426* (2013.01); *G09G 2310/0264* (2013.01); *G09G 2310/0281* (2013.01); *H01L 27/3276* (2013.01)

(58) Field of Classification Search
CPC .............. G09G 3/3266; G09G 3/3275; G09G 2300/0426
See application file for complete search history.

(56) References Cited

U.S. PATENT DOCUMENTS

2006/0077191 A1    4/2006   Ming-Daw et al.
2008/0048934 A1*   2/2008   Yamamoto .......... G02F 1/13454
                                                345/55
(Continued)

FOREIGN PATENT DOCUMENTS

| KR | 10-1036418 B1 | 5/2011 |
|---|---|---|
| KR | 10-2011-0065823 A | 6/2011 |
| KR | 10-2014-0109261 A | 9/2014 |

OTHER PUBLICATIONS

Extended European Search Report dated Nov. 3, 2016 in Corresponding European Patent Application No. 16154011.7.

(Continued)

*Primary Examiner* — Gene W Lee
(74) *Attorney, Agent, or Firm* — Lee & Morse, P.C.

(57) ABSTRACT

A display includes a plurality of pixels in a non-quadrangular display area and a plurality of first driving circuits and a plurality of second driving circuits in a peripheral area of the display area. Each of the pixels is connected to a first signal line in a first direction and a second signal line in a second direction crossing the first direction. Each of the first driving circuits outputs a first signal to the first signal line of a corresponding one of the pixels. Each of the second driving circuits outputs a second signal to the second signal line of a corresponding one of the pixels. The number of second driving circuits between neighboring first driving circuits is different depending on a position in the peripheral area.

20 Claims, 17 Drawing Sheets

(51) Int. Cl.
   *G02F 1/1345*   (2006.01)
   *G09G 3/20*    (2006.01)
   *H01L 27/32*   (2006.01)

(56)             References Cited

U.S. PATENT DOCUMENTS

2008/0266210 A1* 10/2008 Nonaka .................. G09G 3/20
                                                      345/55
2009/0309813 A1* 12/2009 Fujita ................ G02F 1/133512
                                                      345/55
2014/0118409 A1*  5/2014 Jun ..................... G09G 5/02
                                                     345/690
2016/0027380 A1*  1/2016 Kim .................... G09G 3/3258
                                                     315/172
2016/0113106 A1*  4/2016 Kim ..................... H05K 1/028
                                                     361/749

OTHER PUBLICATIONS

European Search Report dated Jul. 28, 2016 in Corresponding European Patent Application No. 16154011.7.

* cited by examiner

NON-QUADRANGULAR DISPLAY

CROSS-REFERENCE TO RELATED APPLICATION

Korean Patent Application No. 10-2015-0021599, filed on Feb. 12, 2015, and entitled, "Non-quadrangular Display," is incorporated by reference herein in its entirety.

BACKGROUND

1. Field

One or more embodiments described herein relate to a non-quadrangular display.

2. Description of the Related Art

A display panel includes signal lines connected to pixels. The pixels are in a display region having a quadrangular shape, and a driving circuit for supplying signals to the signal lines are in a bezel area around the quadrangular display region. The display region may be increased and the bezel area reduced to produce a large panel.

Recently, demand for displays having non-quadrangular shapes (e.g., circle or oval) has increased. Such a display may be suitable for use in wearable devices, e.g., smartwatches, smart glass, and head mounted displays or vehicle clusters. However, the bezel areas for these displays may be reduced to a vary narrow size in order to increase the size of the display panel screen. A narrower bezel area leaves less room for the driving circuits.

SUMMARY

In accordance with one or more embodiments, a non-quadrangular display includes a plurality of pixels in a non-quadrangular display area, each of the pixels connected to a first signal line in a first direction and a second signal line in a second direction crossing the first direction; a plurality of first driving circuits in a peripheral area of the display area, each of the first driving circuits to output a first signal to the first signal line of a corresponding one of the pixels; and a plurality of second driving circuits in the peripheral area, each of the second driving circuits to output a second signal to the second signal line of a corresponding one of the pixels, wherein a number of the second driving circuits between neighboring first driving circuits is different depending on a position of the peripheral area.

The first driving circuits and the second driving circuits may be adjacent a circumference of the display area. Angles for arranging the first driving circuits and the second driving circuits may be changed according to positions of the first driving circuits and the second driving circuits. The angles are changed equally to normal directions of the circumference of the display area which is corresponding to the positions of each of the first driving circuits and the second driving circuits.

An area of the first driving circuit for at least one pixel may be different from an area of the second driving circuit for at least one pixel. A sum of widths of display areas of the first driving circuits and the second driving circuits alternately disposed and adjacently provided in a tangential direction may be less than half the width of the pixel.

The display area may include a curved area, and the pixels may be arranged in a matrix form in the curved area. When a step is between neighboring arrangements of the pixels, the first driving circuit or the second driving circuit in the peripheral area may correspond to the step according to a type of the step.

The pixels may include a plurality of subpixels, the subpixels may emit different colors of light, and the subpixels may be controlled by second signals transmitted through the second signal lines in synchronization with first signals transmitted through the first signal lines. The subpixels may include switching transistors, each of the switching transistors include a first electrode connected to a respective one of the second signal lines and the first signal lines as gate electrodes, and driving transistors, each of the driving transistors including a gate electrode connected to a second electrode of a respective one of the switching transistors, a first electrode to receive a power voltage and a second electrode connected to an organic light emitting diode.

Each of the subpixels may receive an initialization voltage in synchronization with first signals transmitted through respective first signal lines corresponding to a previous pixel row. Each of the subpixels may include a compensation transistor connected between the gate electrode and the second electrodes of the driving transistors, the gate electrode included as part of a corresponding first signal line.

The first signal lines and the second signal lines of the pixels may not cross each other in the peripheral area. Each the pixels may be connected to a third signal line in the first direction, and the display may include a plurality of third driving circuits alternately disposed with at least one of the second driving circuits, each of the third driving circuits to output a third signal to a third signal line of at least one of the pixels in a region facing the first driving circuits in the peripheral area.

In accordance with one or more other embodiments, a non-quadrangular display includes a display area including a curved portion, the display area including a plurality of pixels disposed so that steps in a row direction and a column direction correspond to the curved portion; and a non-display area including first driving circuits to supply a first signal to respective pixels in the row direction and second driving circuits to supply a second signal to respective pixels in the column direction, different numbers of the first and second driving circuits disposed on a circumference of the display area.

At least one of the first driving circuits may be provided in substantially a normal direction in which the pixels have steps in the row direction. At least one of the second driving circuits may be provided in substantially a normal direction in which the pixels have steps in the column direction. The non-display area may have a predetermined width along a circumference of the display area. Each of the first driving circuit and the second driving circuit may have substantially rectangular shape and substantially a same length of a long side. A width of the non-display area may be greater than the length of the long side and less than a sum of both long side lengths of the substantially rectangular shape.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
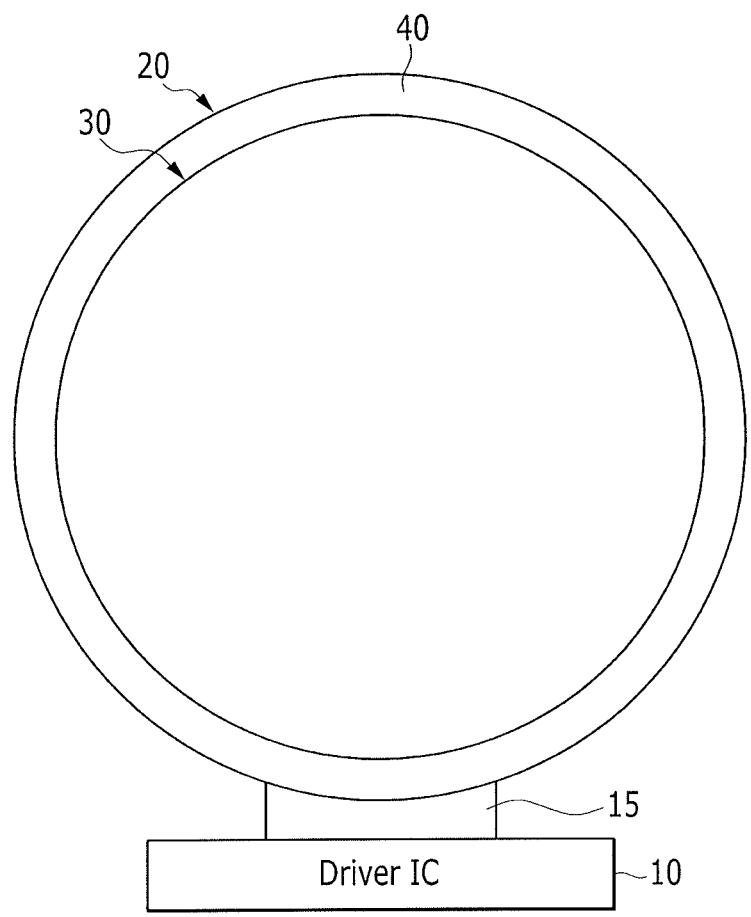
FIG. 1 illustrates an embodiment of a non-quadrangular display.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments. Like reference numerals refer to like elements throughout.

It is to be understood that when one component is referred to as being "connected" or "coupled" to another component, it may be connected or coupled directly to another component or be connected or coupled to another component with the other component intervening therebetween. On the other hand, it is to be understood that when one component is referred to as being "directly connected or coupled" to another component, it may be connected to or coupled to another component without the other component intervening therebetween.

FIG. 1 illustrates an embodiment of a non-quadrangular display which includes a driver IC 10, a display panel 20, and a connector 15 for connecting the driver IC 10 and the display panel 20. The display panel 20 may has a predetermined shape that is not quadrangular, e.g., a circle, an oval, a polygon with a partial circle, or a polygon except a quadrangle. In one embodiment, the arbitrary format may include a figure partly configured with a curve. The display panel 20 may be a flexible display panel that includes at least one curved portion.

The driver IC 10 outputs a driving signal for driving the driving circuit of the display panel 20. The driving signal may be transmitted to the display panel 20 through the connector 15. Based on the driving signal transmitted to the driver IC 10, signals corresponding to the pixels may be appropriately transmitted to the signal lines formed on the display panel 20.

Figure 2:
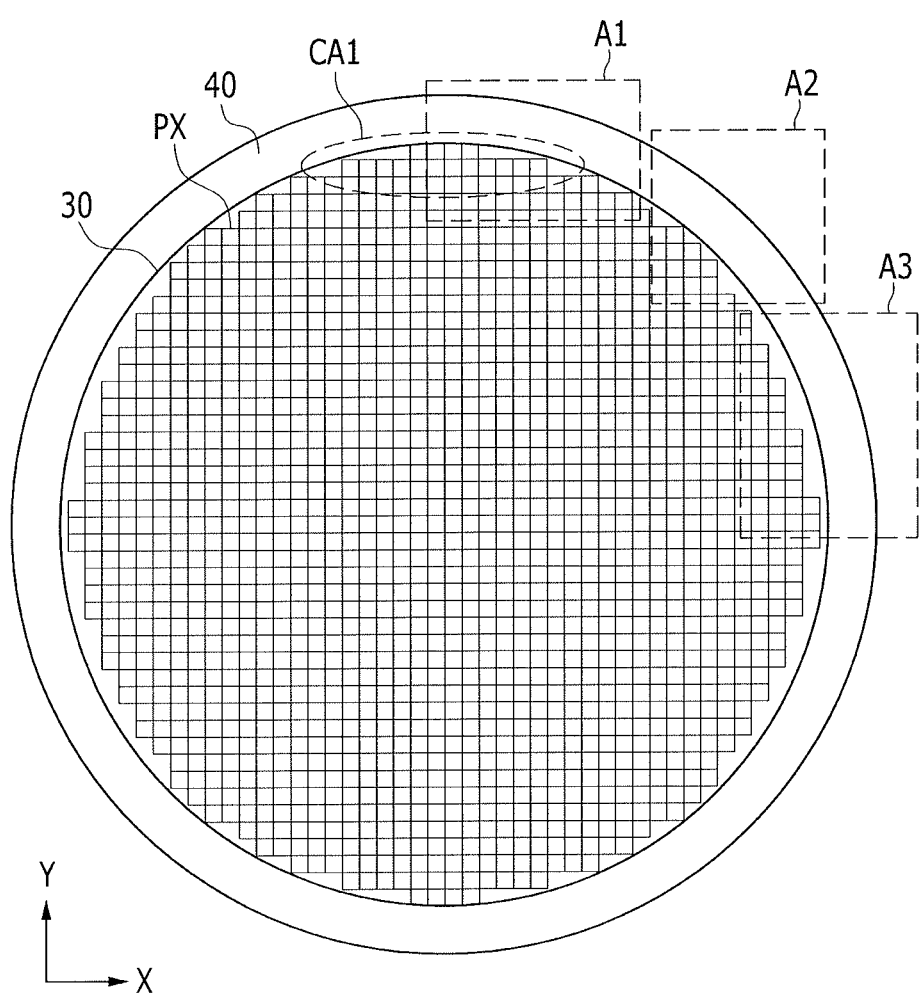
FIG. 2 illustrates an embodiment of a display panel.

FIG. 2 illustrates an embodiment of a display panel of the display in FIG. 1. As illustrated in FIG. 2, the form or shape of the display area 30 may be determined based on the form or shape of the display panel 20, e.g., when the display panel 20 is circular, the display area 30 may be circular and/or when part of the display panel 20 is curved, the display area 30 corresponding to the part may be a curve. A non-display area 40 including a driving circuit is in a region excluding the display area 30 on the display panel 20.

A plurality of pixels PX are in the display area 30. The pixels PX may be disposed in a matrix format in the display area 30. The pixels PX may be disposed to correspond to the curve in the display area 30. For example, when the display area 30 is circular, a step may be generated between the arrangements of pixels on an edge of the display area 30.

For example, quadrangular pixels PX are disposed on the curved edge of the display area 30 to form a step arrangement among the rows of pixels. In one embodiment, a step is formed between the pixel arrangement of the first row and the pixel arrangement of the second row by the difference of a predetermined number (e.g., eight) pixels PX on the edge CA1 of the display area 30 corresponding to the first row and the second row.

The step between the pixel arrangements for neighboring rows or columns may be different according to the position of the corresponding edge. For example, the step based on the difference of eight pixels may be generated between the pixel arrangement of the first row and the pixel arrangement of the second row, and a step based on the difference of six pixels may be formed between the pixel arrangement of the second row and the pixel arrangement of the third row.

The driving circuit is formed in the non-display area 40 according to the shape of the display area 30. For example, when the pixels PX are arranged in a circular form, the driving circuit for supplying signals to the pixels PX may be in a circumferential area adjacent the circle on which the pixels PX are disposed. When the display panel 20 is circular, the shape of the display area 30 including the pixels PX and the non-display area 40 including the driving circuit may be circular. Further, the non-display area 40 may be formed adjacent the circumference of the display area 30 on the same substrate as the display area 30.

The shape of the non-display area 40 may be determined by the shape of the display area 30. For example, when the pixels PX are disposed in a circular manner, the non-display area 40 may be formed as a ring with a predetermined width on the circumference of the display area 30.

In FIG. 2, the shapes and sizes of the pixels PX are the same. In another embodiment, the sizes of the pixels PX in two or more regions of the display area 30 may be different. For example, a pixel in a center region of the display area 30 may be larger than a pixel on the edge of the display area 30.

Figure 3:
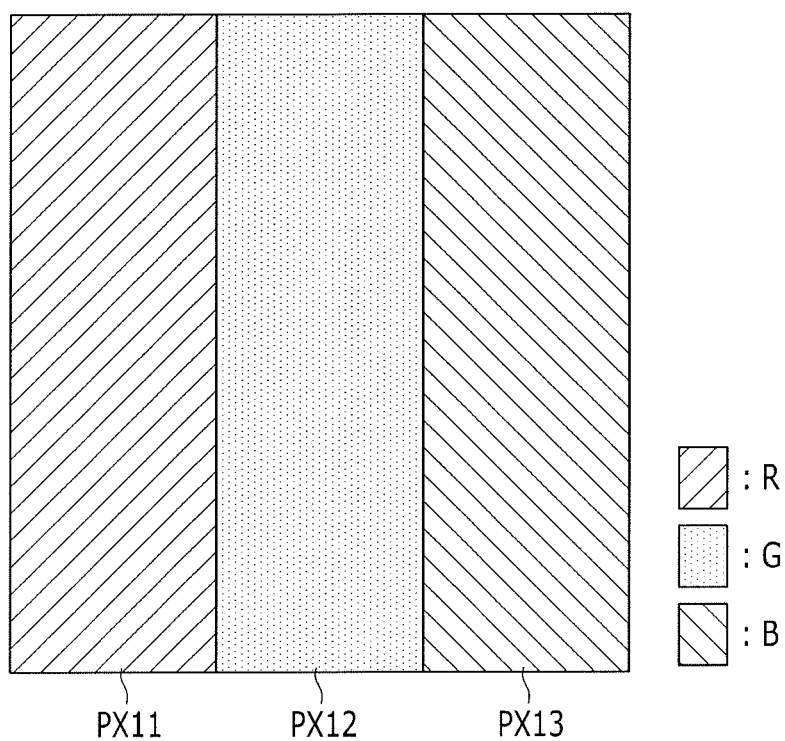
FIG. 3 illustrates an embodiment of a pixel.
Figure 4:
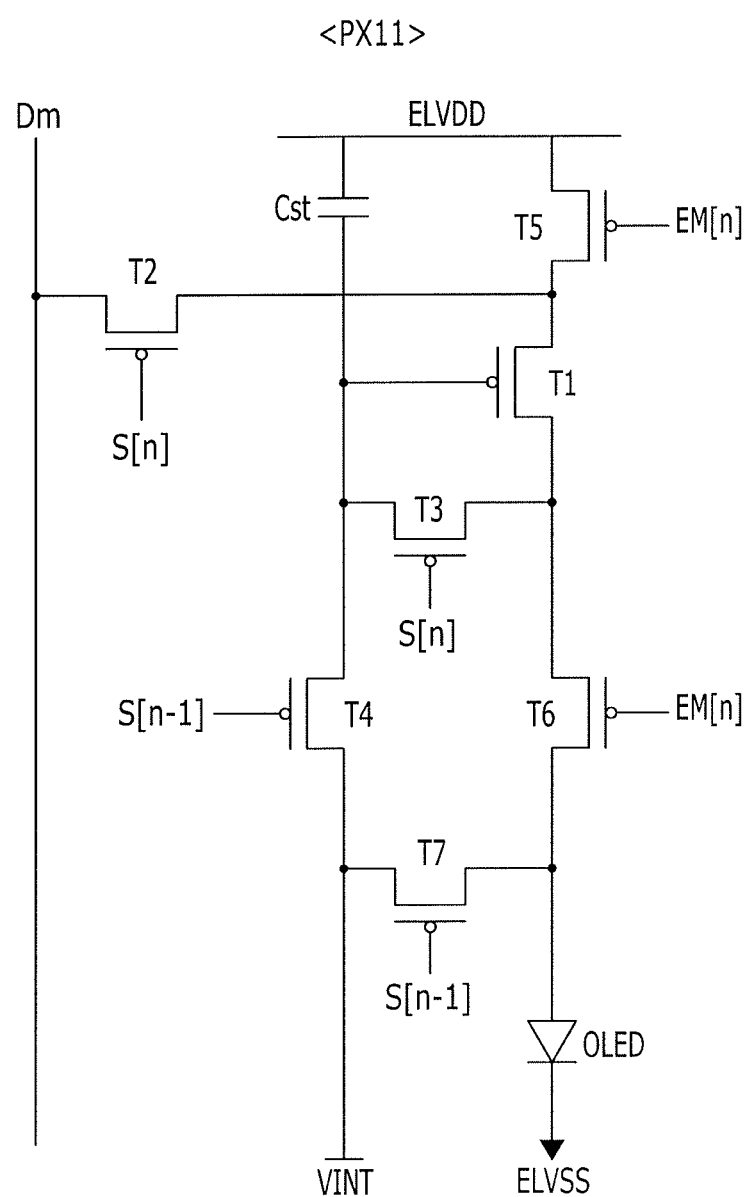
FIG. 4 illustrates an embodiment of a subpixel.

FIG. 3 shows an embodiment of a pixel PX, and FIG. 4 shows an equivalent circuit diagram of an embodiment of a subpixel of the pixel PX. As illustrated in FIG. 3, a pixel PX may include a plurality of subpixels emitting light of different primary colors. For example, pixel PX may include three subpixels PX11, PX12, and PX13 that emit red, green, and blue light, respectively.

As illustrated in FIG. 4, the subpixel PX11 includes a plurality of transistors connected to a plurality of signal lines, a storage capacitor (Cst), and an organic light emitting diode (OLED). The transistors include a driving thin film transistor T1, a switching thin film transistor T2, a compensation transistor T3, an initialization transistor T4, an operation control transistor T5, an emission control transistor T6, and a bypass transistor T7.

The signal lines include a scan line (S[n]) for transmitting a scan signal, a previous scan line (S[n−1]) for transmitting a previous scan signal to the initialization transistor T4, an emission control line (EM[n]) for transmitting an emission control signal to the operation control transistor T5 and the emission control transistor T6, a data line (D[m]) crossing the scan line and transmitting a data signal, a power voltage line for transmitting a power voltage, and an initialization voltage line for transmitting an initialization voltage for initializing the driving transistor T1.

The driving transistor T1 includes a first terminal connected to a first node N1, a gate connected to a second node N2, and a second terminal connected to a third node N3. The driving transistor T1 is turned on by a voltage applied to the gate to control a driving current supplied to the organic light emitting element (OLED).

The second transistor T2 includes a first terminal connected to the data line (D[m]) for supplying the corresponding data signal, a gate connected to the scan line (S[n]) for supplying the corresponding present scan signal, and a second terminal connected to the first node N1. The second transistor T2 is turned on by the scan signal to transmit the data signal to the first node N1.

The first capacitor Cst includes a first terminal connected to a power voltage line for supplying a first power voltage (ELVDD) and a second terminal connected to the second node N2.

The third transistor T3 includes a first terminal connected to the second node N2, a second terminal connected to the third node N3, and a gate connected to the present scan line (S[n]). The third transistor 13 is turned on by the present scan signal to connect the second node N2 and the third node N3.

The fourth transistor T4 includes a first terminal connected to the second node N2, a second terminal connected to an initialization line for supplying an initialization voltage (VINT), and a gate connected to the scan line (S[n−1]) provided in the previous pixel row. The fourth transistor T4 is turned on by the scan signal of the scan line (S[n−1]) provided in the previous pixel row to initialize the second node N2 with the initialization voltage (VINT).

The fifth transistor T5 includes a first terminal connected to a first power voltage (ELVDD), a second terminal connected to the first node N1, and a gate connected to an emission line for supplying a corresponding emission signal. The fifth transistor T5 is turned on by the emission signal.

The sixth transistor T6 includes a first terminal connected to the third node N3, a second terminal connected to an anode of the organic light emitting element (OLED), and a gate connected to the emission line for supplying the emission signal. The sixth transistor T6 is turned on by the emission signal to transmit a current flowing through the first transistor T1 to the organic light emitting element (OLED).

The seventh transistor T7 includes a first terminal connected to the anode of the organic light emitting element (OLED), a second terminal connected to the initialization line, and a gate connected to the scan line (S[n−1]) provided in the previous pixel row. The seventh transistor T7 is turned on by the scan signal provided in the previous pixel row to transmit the initialization voltage (VINT) to the anode of the organic light emitting element (OLED).

The organic light emitting element (OLED) includes an anode connected to the second terminal of the sixth transistor T6 and a cathode connected to a second power voltage (ELVSS). The organic light emitting element (OLED) may emit one light of the primary colors. The primary colors may include, for example, red, green, and blue, and desired colors may be displayed based on a spatial sum or a temporal sum of the three primary colors.

The initialization voltage (Vint) may be supplied to the gate electrodes of the respective driving transistors T1 of the subpixels PX11, PX12, and PX13 in synchronization with a plurality of scan signals supplied through the scan line (S[n−1]) provided in the previous pixel row. A plurality of data signals are transmitted through data lines (D[m]) corresponding to respective ones of the subpixels PX11, PX12, and PX13 in synchronization with scan signals supplied through the scan lines in the present subpixel row. The first power voltage (ELVDD) supplied through a plurality of first power voltage lines is a voltage for driving the subpixels PX11, PX12, and PX13. Emission of the organic light emitting diode (OLED) is controlled by emission control signals supplied through emission control lines (EM[n]).

The driving circuit includes a first driving circuit for supplying a scan signal to the scan line (S[n]), a second driving circuit for supplying an emission control signal to the emission control line (EM[n]), and a third driving circuit for supplying a data signal to the data line (D[m]). The driving circuit further includes a fourth driving circuit for supplying a test voltage to the data line (D[m]) to test whether the display panel 20 has a fault during a process for manufacturing the display panel 20.

The driving circuits are disposed on the display panel 20 and supply appropriate signals to the pixels PX. The methods used to supply signals to the pixels PX may depend, for example, on the type of driving circuits. For example, the first driving circuit and the second driving circuit supply signals in a first direction, and the third driving circuit and the fourth driving circuit supply signals in a second direction crossing the first direction. When the pixels PX are arranged in a matrix format, the first driving circuit and the second driving circuit supply the signals for respective rows, and the third driving circuit and the fourth driving circuit supply the signals for respective columns.

The driving circuits are arranged in the non-display area 40 so that the non-display area 40 occupies a narrow region on the display panel 20. However, when the pixels PX are arbitrarily disposed on the display panel 20, a step may occur between the pixel arrangements. In this case, the driving circuits are disposed in a manner different from the driving circuits in a quadrangular display panel.

Figure 5:
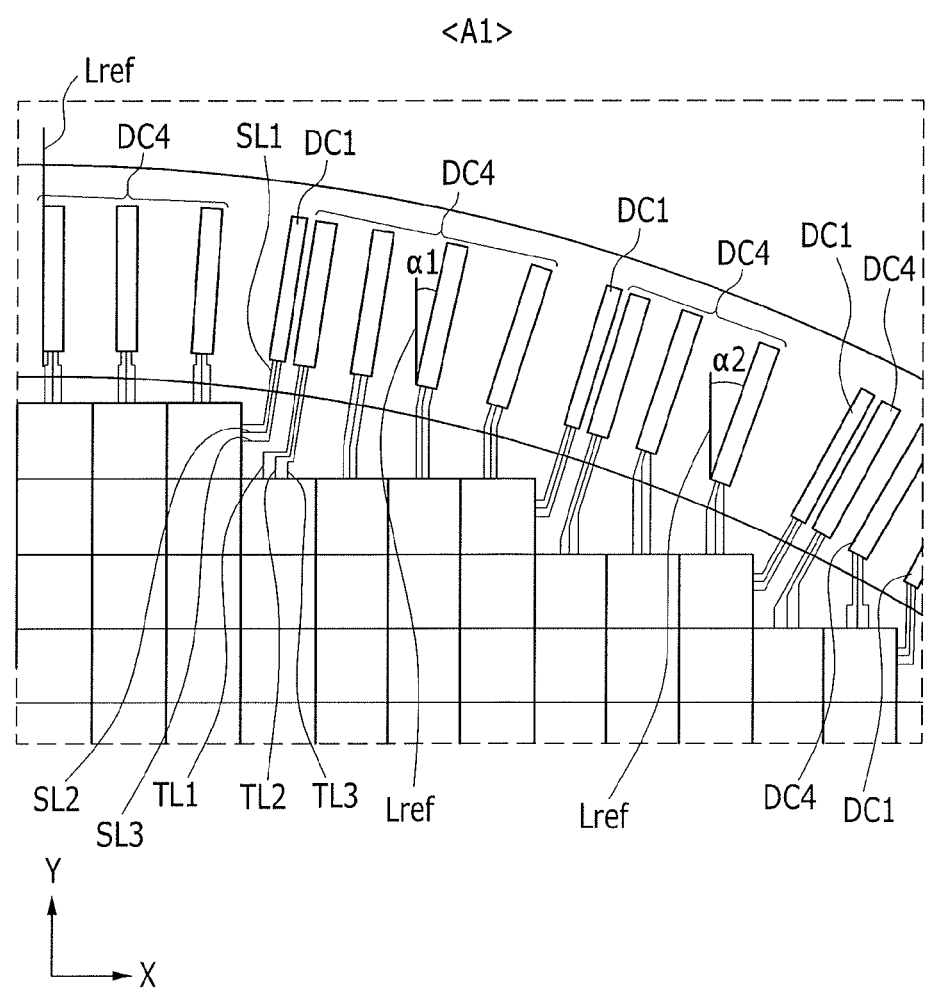
FIG. 5 illustrates an embodiment including a pixel at a first position on an edge of a display panel and a driving circuit.

FIG. 5 illustrates a first embodiment of a pixel PX at a first position A1 on an edge of a display panel 20 and a driving circuit. As shown, the driving circuit is in the non-display area 40.

In this embodiment, the first driving circuit DC1 and the fourth driving circuit DC4 are illustrated, and different types of driving circuits (a first driving circuit, a second driving circuit, a third driving circuit, and a fourth driving circuit) may be disposed at respective positions in the non-display area 40. In one embodiment, the non-display area 40 may include a region in which the first driving circuit DC1 and the fourth driving circuit DC4 are disposed, a region in which the second driving circuit DC2 and the fourth driving circuit DC4 are disposed, a region in which the first driving circuit DC1 and the third driving circuit are disposed, and a region in which the second driving circuit DC2 and the third driving circuit are disposed.

Different types and numbers of driving circuits may be disposed along the circumference of the display area 30 in the non-display area 40. In this instance, different types of driving circuits may be disposed for respective pixel rows or pixel columns. For example, the first driving circuit DC1 may correspond to the pixel row and the fourth driving circuit DC4 may correspond to the pixel column. As shown, on the first position A1, four first driving circuits DC1 correspond to four pixel rows and twelve fourth driving circuits DC4 correspond to twelve pixel columns at the first position A1.

The areas occupied by the respective different types of driving circuits may be different. For example, the area of one first driving circuit DC1 may be different from the area of one fourth driving circuit DC4. When the first driving circuit DC1 and the fourth driving circuit DC4 are formed to be rectangular and have a same long-side length, their short-side lengths may be different. The width of the non-display area 40 may be formed to be less than a sum of the long-side lengths of two driving circuits and greater than a long-side length of one driving circuit. In one embodiment, the width of the non-display area 40 may be substantially the same as the long-side length of one driving circuit, and the width of the non-display area 40 may be designed to be narrow.

The driving circuits may be inclined at a corresponding angle with respect to a flat surface based on the shape of the display area 30. For example, the driving circuits may be inclined with substantially the same angle as a normal angle on a border between the display area 30 and the non-display area 40 and may be in the non-display area 40.

When the display area 30 is curved, a normal direction of the border between the display area 30 and the non-display area 40 changes along the circumference of the display area 30. Thus, a disposal angle of the driving circuits that are disposed along the circumference of the display area 30 with respect to a reference line (Lref) is changed in the normal direction. The leftmost fourth driving circuit DC4 is parallel to the reference line (Lref) in FIG. 5. However, the driving circuits DC1 and DC4 disposed to the right of the fourth driving circuit DC4 along the circumference of the display area 30 are inclined so that their angles from the reference line (Lref) gradually increase.

In the case of a same type of driving circuit DC4, the disposition angles α1 and α2 with respect to the reference line (Lref) are changeable depending on the position of the pixel row or the pixel column. For example, the disposition angles α1 and α2 of the fourth driving circuits DC4 corresponding to the different pixel columns are different from each other.

The driving circuits are arranged in series in the non-display area 40. The types of driving circuits are changed and are then arranged in a single column along the circumference of the display area 30. For example, in FIG. 5, the driving circuits starting from the fourth driving circuit DC4 provided leftmost to the first driving circuit DC1 provided rightmost are arranged in a single column along the circumference of the display area 30 while the types thereof DC1 and DC4 are changed.

When a step occurs between the pixel arrangements, the type of the driving circuit is changed and disposed depending on the type of the corresponding step. When the step is generated between the pixel arrangements for the respective rows, the first driving circuit DC1 is disposed corresponding to the corresponding step. When the step is generated for the respective columns, the fourth driving circuit DC4 is disposed corresponding to the corresponding step. The first driving circuit DC1 supplies signals to different pixel rows, and the fourth driving circuit DC4 supplies signals to different pixel columns.

One driving circuit supplies the signal to the pixels PX in one row or one column. One pixel PX includes a plurality of subpixels PX11, PX12, and PX13. Thus, one driving circuit supplies signals to the subpixels PX11, PX12, and PX13 in one pixel row or one pixel column. Therefore, a plurality of signal wires for supplying signals to one pixel row or one pixel column by one driving circuit are formed. For example, one first driving circuit DC1 supplies a scan signal to one pixel row, and a plurality of pixels PX including an R subpixel, a G subpixel, and a B subpixel are formed in one pixel row. A scan wire SL1 for supplying a scan signal to a plurality of R subpixels, a scan wire SL2 for supplying a scan signal to a plurality of G subpixels, and a scan wire SL3 for supplying a scan signal to a plurality of B subpixels are formed corresponding to one first driving circuit DC1. This is applicable to other cases, e.g., where the signal wire is connected to different types of driving circuits DC2, DC3, and DC4 in a like manner.

The signal wires for the driving circuits to supply signals to the pixels PX are formed to not cross each other in the non-display area 40. The signal wires connected to the different types of driving circuits are formed to not cross each other in the non-display area 40. For example, the signal wires SL1 to SL3 for connecting the neighboring first driving circuit DC1 and the pixel row are formed to cross the signal wires TL1 to TL3 for connecting the fourth driving circuit DC4 and the pixel column. Therefore, capacitive coupling caused by parasitic capacitor formed by the crossing of the signal wires in the non-display area 40 is reduced.

Figure 6:
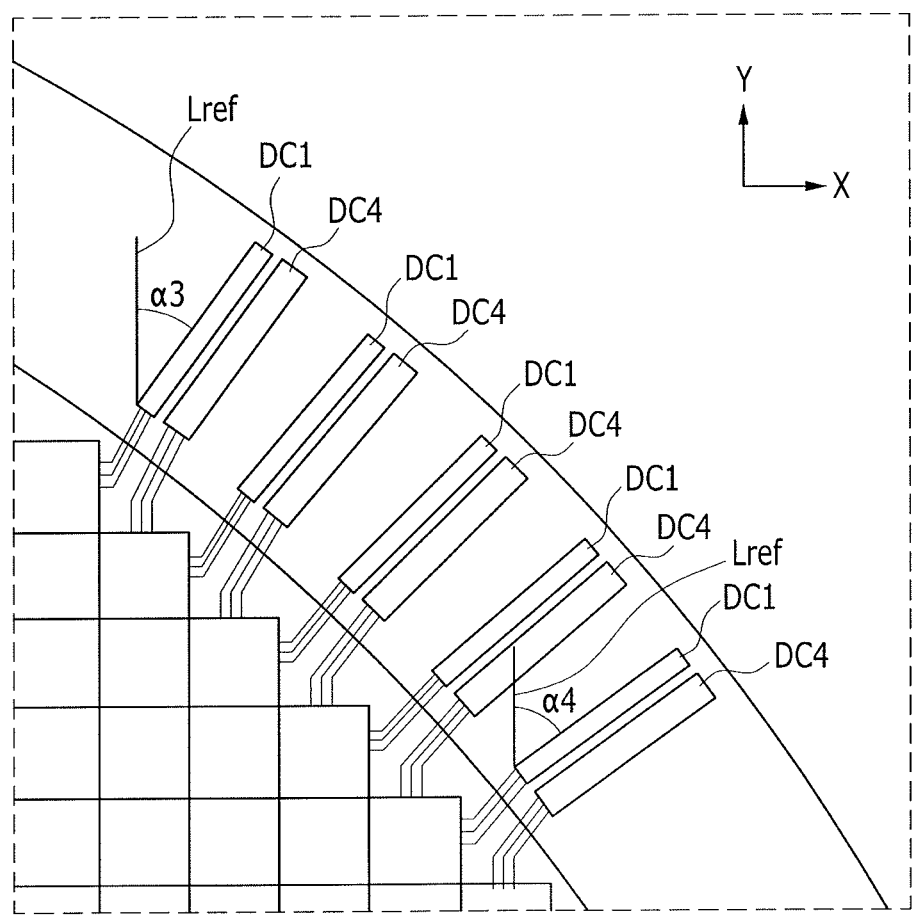
FIG. 6 illustrates an embodiment including a pixel at a second position on an edge of a display panel and a driving circuit.

FIG. 6 shows an embodiment of a pixel PX at a second position A2 on an edge of the display panel 20 and a driving circuit. In FIG. 6, the driving circuits DC1 and DC4 are disposed in the non-display area 40 in a manner similar to FIG. 5. Different types of driving circuits DC1 and DC4 may be disposed to correspond to respective pixel rows or pixel columns. For example, the first driving circuit DC1 may correspond to the pixel row, and the fourth driving circuit DC4 may correspond to the pixel column. As illustrated, at the second position A2, five first driving circuits DC1 are disposed to correspond to the five pixel rows and five fourth driving circuits DC4 are disposed to correspond to the five pixel columns.

The driving circuits DC1 and DC4 may be inclined at an angle with respect to the plane depending on the shape of the display area 30. When the angle inclined in a clockwise direction with respect to the reference line (Lref) is measured in FIG. 6, the angle α4 formed when the fourth driving circuit DC4 provided rightmost is inclined from the reference line (Lref) is greater than the angle α3 formed when the first driving circuit DC1 provided leftmost is inclined from the reference line (Lref).

The driving circuits DC1 and DC4 are arranged in series in the non-display area 40. The types of the driving circuits DC1 and DC4 are changed and arranged in a column along the circumference of the display area 30. For example, in FIG. 6, the driving circuits starting from the fourth driving circuit DC4 provided leftmost to the first driving circuit DC1 provided rightmost are arranged in a single column along the circumference of the display area 30 while the types thereof are changed.

When a step occurs between the pixel arrangements, the type of the driving circuit is changed and disposed depending on the type of the corresponding step. When the step is generated between the pixel arrangements for respective rows, the first driving circuit DC1 corresponds to the corresponding step. When the step is generated for respective columns, the fourth driving circuit DC4 corresponds to the corresponding step. The first driving circuit DC1 supplies signals to different pixel rows, and the fourth driving circuit DC4 supplies signals to different pixel columns. Regarding FIG. 6, the step is generated in the row direction and the column direction by one pixel PX, so the first driving circuit DC1 and the fourth driving circuit DC4 are alternately disposed.

The sum of the tangential-directional widths of the display areas 30 of the first driving circuit DC1 and the fourth driving circuit DC4, that are alternately disposed and provided to neighbor each other, may be less than half the width of the pixel PX. Further, the sum of the widths of the two driving circuits neighboring each other may be less than half the width of the pixel PX.

One driving circuit supplies a signal to the pixels PX in a row or a column. One pixel PX includes a plurality of subpixels PX11, PX12, and PX13. One driving circuit supplies the signal to a plurality of subpixels PX11, PX12, and PX13 in one pixel row or one pixel column. Therefore, a plurality of signal wires for one driving circuit are formed to supply signals to one pixel row or one pixel column. The signal wires for the driving circuits DC1 and DC4 to supply signals to the pixels PX are formed to not cross each other in the non-display area 40. The signal wires connected to different types of driving circuits DC1 and DC4 are formed to not cross each other in non-display area 40.

Figure 7:
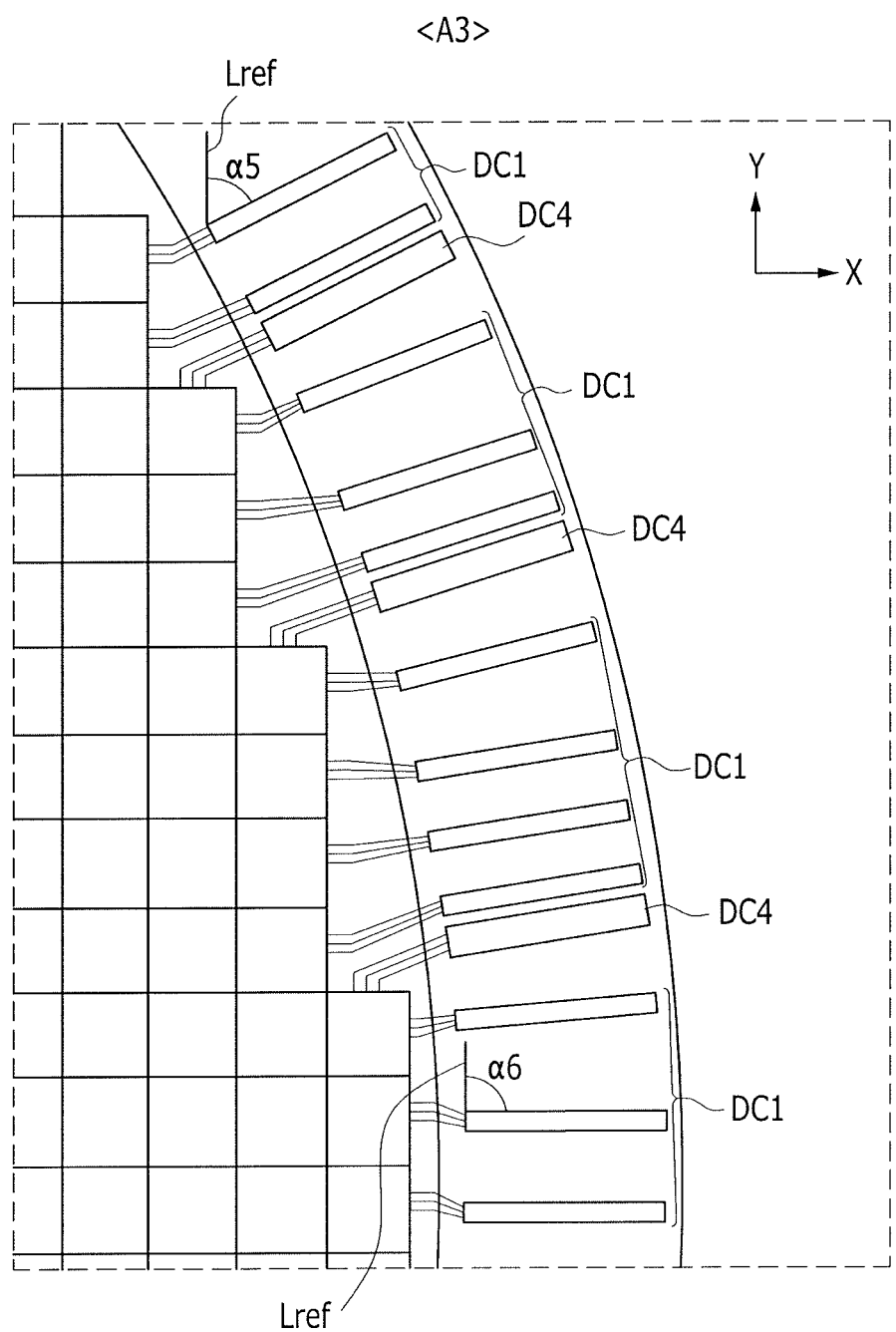
FIG. 7 illustrates an embodiment of a pixel at a third position on an edge of a display panel and a driving circuit.

FIG. 7 illustrates an embodiment of a pixel PX at a third position A3 on an edge of a display panel 20 and a driving circuit. In FIG. 7, the driving circuit is in the non-display area 40 in a manner similar to FIG. 5. Different types of driving circuits DC1 and DC4 may correspond to respective pixel rows or pixel columns. For example, the first driving circuit DC1 may correspond to the pixel row, and the fourth driving circuit DC4 may correspond to the pixel column. As shown, on the third position A3, twelve first driving circuits DC1 correspond to the twelve pixel rows and three fourth driving circuits DC4 correspond to the three pixel columns.

The driving circuits DC1 and DC4 may be inclined at an angle with respect to the plane depending on the shape of the display area 30. When the angle inclined in the clockwise direction is measured in FIG. 7, the angle α6, formed when the first driving circuit DC1 provided rightmost is inclined from the reference line (Lref) is greater than the angle α5 formed when the first driving circuit DC1 provided to the leftmost, is inclined from the reference line (Lref).

The driving circuits DC1 and DC4 are arranged in series in the non-display area 40. The types of the driving circuits DC1 and DC4 are changed and arranged in a column along the circumference of the display area 30. For example, in FIG. 7, the driving circuits starting from the first driving circuit DC4 provided leftmost to the first driving circuit DC1 provided rightmost are arranged in a single column along the circumference of the display area 30 while the types thereof are changed.

When a step occurs between the pixel arrangements, the type of driving circuit is changed and disposed depending on the type of the corresponding step. When the step is generated between the pixel arrangements for respective rows, the first driving circuit DC1 corresponds to the corresponding step. When the step is generated for the respective columns, the fourth driving circuit DC4 corresponds to the corresponding step. The first driving circuit DC1 supplies signals to different pixel rows, and the fourth driving circuit DC4 supplies signals to different pixel columns.

One driving circuit supplies a signal to the pixels PX in a row or a column. One pixel PX includes a plurality of subpixels PX11, PX12, and PX13. Thus, one driving circuit supplies the signal to a plurality of subpixels PX11, PX12, and PX13 in one pixel row or one pixel column. Therefore, a plurality of signal wires for one driving circuit are formed to supply signals to one pixel row or one pixel column. The signal wires for the driving circuits DC1 and DC4 to supply signals to the pixels PX are formed to not cross each other in the non-display area 40. The signal wires connected to different types of driving circuits DC1 and DC4 are formed to not cross each other in non-display area 40.

As illustrated in FIG. 5 to FIG. 7, a different number of driving circuits DC1 and DC4 may be disposed depending on their disposed position on the display panel 20. For example, a plurality of fourth driving circuits DC4 are disposed by the step between the pixel arrangements generated for respective columns on the first position A1. A plurality of first driving circuits DC1 are disposed by the step between the pixel arrangements generated for respective rows on the third position A3. Thus, the types and numbers of the driving circuits on the circumference of the display area 30 change.

Figure 8:
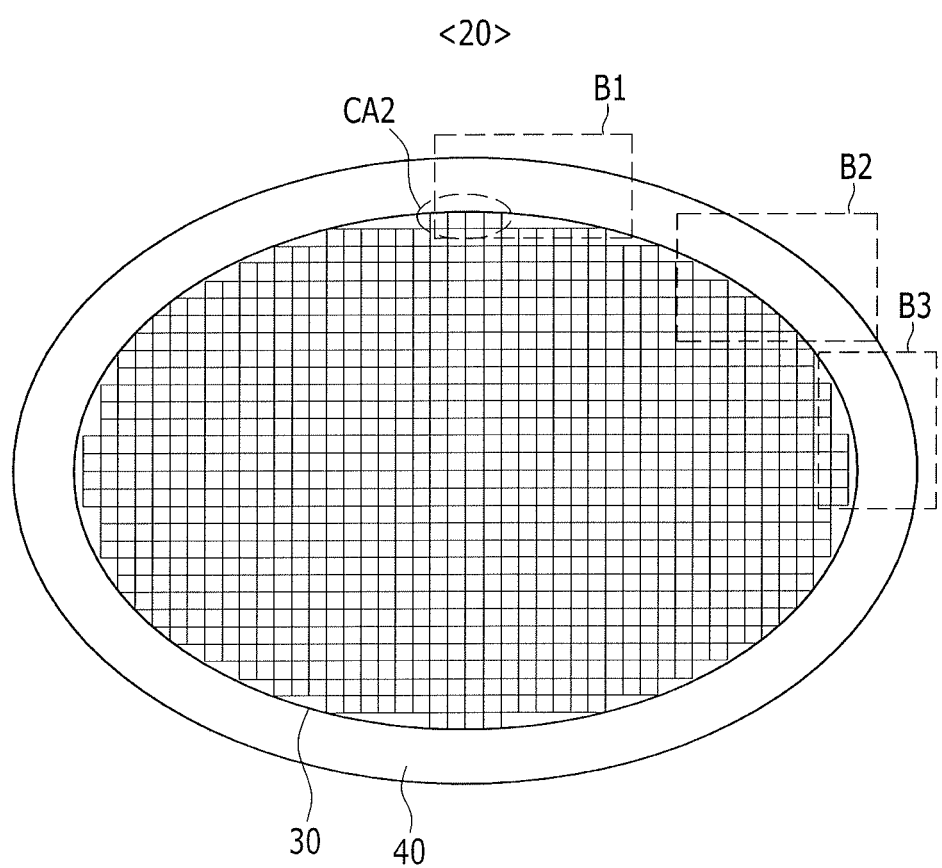
FIG. 8 illustrates another embodiment of a display panel.

FIG. 8 illustrates a second embodiment of a display panel 20. In FIG. 8, the form of the display area 30 may be determined to correspond to the form of the display panel 20. For example, when the display panel 20 is oval, the display area 30 may be oval. When part of the display panel 20 is curved, the display area 30 corresponding to the part is curved. The non-display area 40 including a driving circuit is in a region excluding the display area 30 on the display panel 20.

A plurality of pixels PX are in the display area 30. The pixels PX may be disposed in a matrix format in the display area 30. The pixels PX are appropriately disposed corresponding to the curve in the display area 30. For example, when the display area 30 is oval, a step is generated between arrangements of pixels at an edge of the display area 30.

For example, a quadrangular pixel PX is on a curved edge of the display area 30 so the step is generated between the arrangements of pixels. For example, a step is formed between the pixel arrangement of the first row and the pixel arrangement of the second row by the difference of twelve pixels PX on the edge CA2 of the display area 30 corresponding to the first row and the second row.

The step between pixel arrangements of neighboring rows or columns may be different according to the position of the corresponding edge. For example, the step that corresponds to a difference of twelve pixels PX is generated between the pixel arrangement of the first row and the pixel arrangement of the second row. The step that corresponds to a difference of six pixels PX may be generated between the pixel arrangement of the second row and the pixel arrangement of the third row.

The driving circuit is appropriately formed in the non-display area 40 according to the shape of the display area 30. For example, when the pixels PX are in an oval form, the driving circuit for supplying signals to the pixels PX is provided along the circumference of the oval on which the pixels PX are disposed. When the display panel 20 is oval, a shape formed by the display area 30 including the pixels PX and the non-display area 40 including the driving circuit may be oval.

In FIG. 8, the shapes and sizes of the pixels PX are the same. In one embodiment, the sizes of the pixels PX in two or more regions of the display area 30 may be different. For example, a pixel in a center region of the display area 30 may be larger than a pixel at the edge of the display area 30.

The driving circuits may be appropriately disposed in the non-display area 40 so that the non-display area 40 may occupy a narrow region on the display panel 20. However, when the pixels PX are arbitrarily disposed on the display panel 20, the step occurs between the pixel arrangements so the driving circuits may be disposed in a manner different from a display panel having a quadrangular pixel form.

Figure 9:
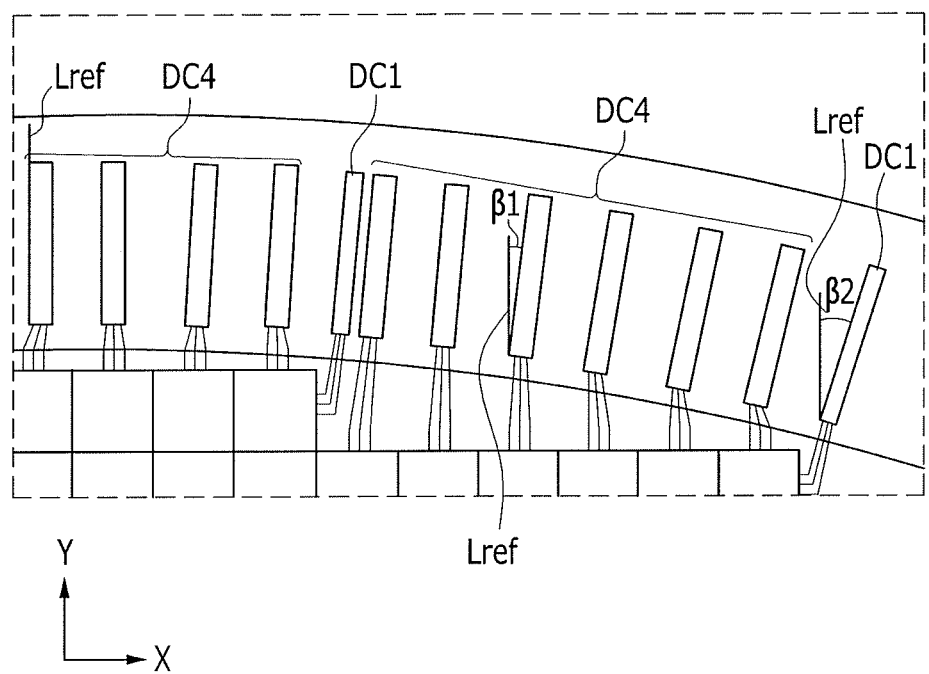
FIG. 9 illustrates an embodiment of a pixel at a first position on an edge of the display panel in FIG. 8 and a driving circuit.

FIG. 9 shows an embodiment including a pixel PX at a first position on an edge of the display panel 20 in FIG. 8 and a driving circuit. In FIG. 9, the driving circuits in the non-display area 40 include the first driving circuit DC1 and the fourth driving circuit DC4. Different types of driving circuits may be disposed at respective positions in the non-display area 40. For example, the non-display area 40 may include a region including the first driving circuit DC1 and the fourth driving circuit DC4, a region including the second driving circuit and the fourth driving circuit DC4, a region including the first driving circuit DC1 and the third driving circuit, and a region including the second driving circuit and the third driving circuit. Different types and numbers of driving circuits may be disposed along the circumference of the display area 30 in the non-display area 40.

In this instance, different types of driving circuits may be disposed for respective pixel rows or pixel columns. For example, the first driving circuit DC1 may correspond to the pixel row and the fourth driving circuit DC4 may correspond to the pixel column. On the first position A1, two first driving circuits DC1 correspond to two pixel rows and ten fourth driving circuits DC4 correspond to ten pixel columns.

The areas occupied by the respective different types of driving circuits may be different. For example, the area of one first driving circuit DC1 may be different from the area of one fourth driving circuit DC4.

The driving circuits DC1 and DC4 may be inclined at a corresponding angle with respect to a flat surface according to a shape of the display area 30. For example, the driving circuits may be inclined at substantially the same angle as a normal angle on a border between the display area 30 and the non-display area 40 and may be disposed in the non-display area 40. When the display area 30 is curved, a normal direction of the border between the display area 30 and the non-display area 40 may change along the circumference of the display area 30. Thus, a disposal angle of the driving circuits along the circumference of the display area 30 with respect to a reference line (Lref) is changed by the normal direction. The fourth driving circuit DC4 provided leftmost is parallel to the reference line (Lref) in FIG. 9. However, the driving circuits DC1 and DC4 disposed to the right from the fourth driving circuit DC4 along the circumference of the display area 30 are inclined, so that their angles β1 and β2 from the reference line (Lref) may gradually increase.

In the case of a same type of the driving circuit, the disposition angles with respect to the reference line (Lref) are changeable depending on the position of the pixel row or the pixel column. For example, the disposition angles of the fourth driving circuits DC4 corresponding to the different pixel rows are different from each other.

The driving circuits DC1 and DC4 are arranged in series in the non-display area 40. The types of the driving circuits DC1 and DC4 are changed and arranged in a single column along the circumference of the display area 30. For example, in FIG. 9, the driving circuits DC1 and DC4 from the fourth driving circuit DC4 provided leftmost to the first driving circuit DC1 provided rightmost are arranged in a single column along the circumference of the display area 30 while the types thereof are changed.

When a step occurs between the pixel arrangements, the type of the driving circuit is changed and disposed depending on the type of the corresponding step. When the step is generated between the pixel arrangements for the respective rows, the first driving circuit DC1 corresponds to the corresponding step. When the step is generated for the respective columns, the fourth driving circuit DC4 corresponds to the corresponding step. The first driving circuit DC1 supplies signals to different pixel rows, and the fourth driving circuit DC4 supplies signals to different pixel columns.

One driving circuit supplies the signal to the pixels PX in one row or one column. One pixel PX includes a plurality of subpixels PX11, PX12, and PX13. Thus, one driving circuit supplies signals to the subpixels PX11, PX12, and PX13 in one pixel row or one pixel column. Therefore, a plurality of signal wires are formed for supplying signals to one pixel row or one pixel column by one driving circuit are formed. For example, one first driving circuit DC1 supplies a scan signal to one pixel row, and a plurality of pixels PX including an R subpixel, a G subpixel, and a B subpixel are formed in one pixel row. Thus, a scan wire for supplying a scan signal to a plurality of R subpixels, a scan wire for supplying a scan signal to a plurality of G subpixels, and a scan wire for supplying a scan signal to a plurality of B subpixels are formed corresponding to one first driving circuit DC1. This may be applicable to other cases in which a signal wire is connected to different types of driving circuits.

The signal wires for supplying signals of the driving circuits DC1 and DC4 to the pixels PX are formed to not cross each other in the non-display area 40. The signal wires connected to the different types of driving circuits are formed to not cross each other in the non-display area 40. For example, the signal wires for connecting the neighboring first driving circuit DC1 and the pixel row are formed to not cross the signal wires for connecting the fourth driving circuit DC4 and the pixel column. Therefore, capacitive coupling caused by parasitic capacitor formed by crossing of signal wires in the non-display area 40 is reduced.

Figure 10:
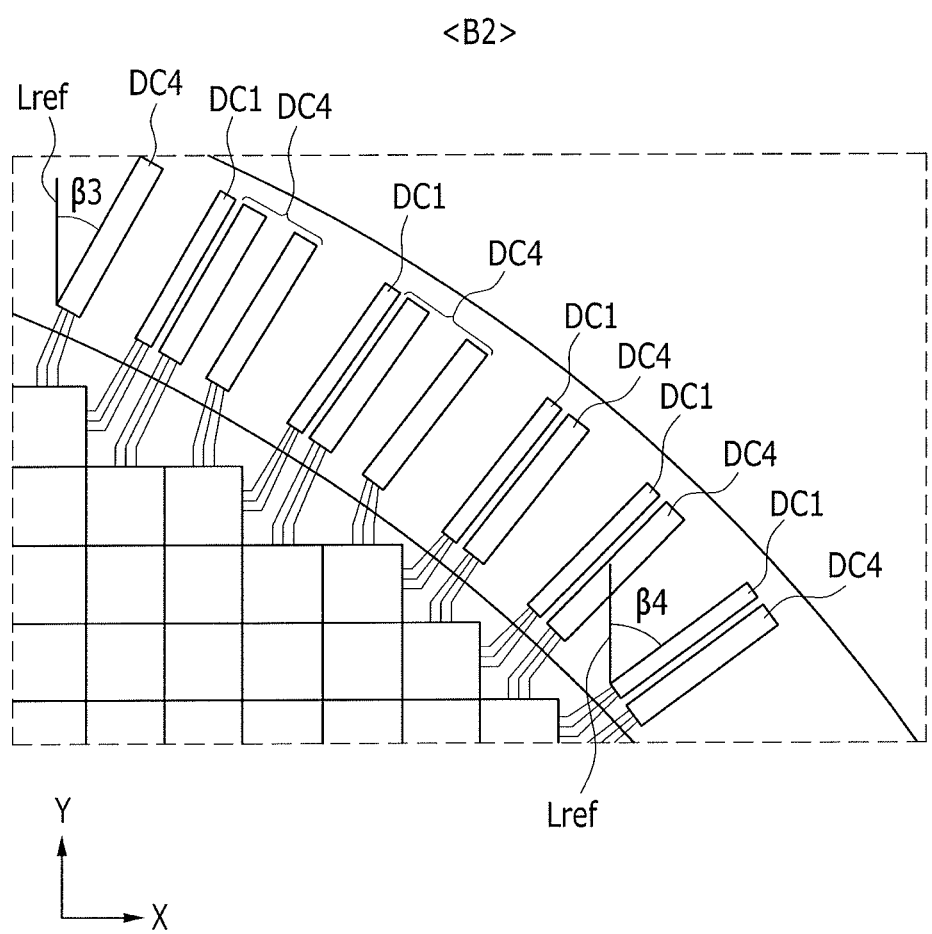
FIG. 10 illustrates an embodiment of a pixel at a second position on an edge of the display panel in FIG. 8 and a driving circuit.

FIG. 10 illustrates an embodiment of a pixel PX at a second position on an edge of a display panel 20 in FIG. 8 and a driving circuit. In FIG. 10, the driving circuits DC1 and DC4 are in the non-display area 40 in a manner similar to FIG. 9. Different types of driving circuits DC1 and DC4 are disposed to correspond to respective pixel rows or pixel columns. For example, the first driving circuit DC1 may correspond to the pixel row and the fourth driving circuit DC4 may correspond to the pixel column. On the second position A2, five first driving circuits DC1 correspond to the five pixel rows and five fourth driving circuits DC4 correspond to the five pixel columns.

The driving circuits DC1 and DC4 may be inclined at an angle with respect to the plane depending on the shape of the display area 30. When the angle inclined in a clockwise direction is measured in FIG. 10, the angle β4 formed when the first driving circuit DC1 provided to the right is inclined from the reference line (Lref) is greater than the angle β3 formed when the fourth driving circuit DC4 provided leftmost is inclined from the reference line (Lref).

The driving circuits DC1 and DC4 are arranged in series in the non-display area 40. The types of the driving circuits DC1 and DC4 are changed and arranged in a column along the circumference of the display area 30. For example, in FIG. 10, the driving circuits DC1 and DC4 from the fourth driving circuit DC4 provided leftmost to the first driving circuit DC1 provided rightmost are arranged in a single column along the circumference of the display area 30 while the types thereof are changed.

When a step occurs between the pixel arrangements, the type of the driving circuit is changed and disposed depending on the type of the corresponding step. When the step is generated between the pixel arrangements for respective rows, the first driving circuit DC1 corresponds to the corresponding step. When the step is generated for respective columns, the fourth driving circuit DC4 corresponds to the corresponding step. The first driving circuit DC1 supplies signals to different pixel rows, and the fourth driving circuit DC4 supplies signals to different pixel columns. Regarding FIG. 10, the step is generated in the row direction and the column direction by one pixel PX so the first driving circuit DC1 and the fourth driving circuit DC4 are alternately disposed.

One driving circuit supplies a signal to the pixels PX in a row or a column. One pixel PX includes a plurality of subpixels PX11, PX12, and PX13. Thus, one driving circuit supplies the signal to the plurality of subpixels PX11, PX12, and PX13 in one pixel row or one pixel column. Therefore, a plurality of signal wires for one driving circuit are formed to supply signals to one pixel row or one pixel column. The signal wires for the driving circuits DC1 and DC4 to supply signals to the pixels PX are formed to not cross each other in the non-display area 40. The signal wires connected to different types of driving circuits are formed to not cross each other in the non-display area 40.

Figure 11:
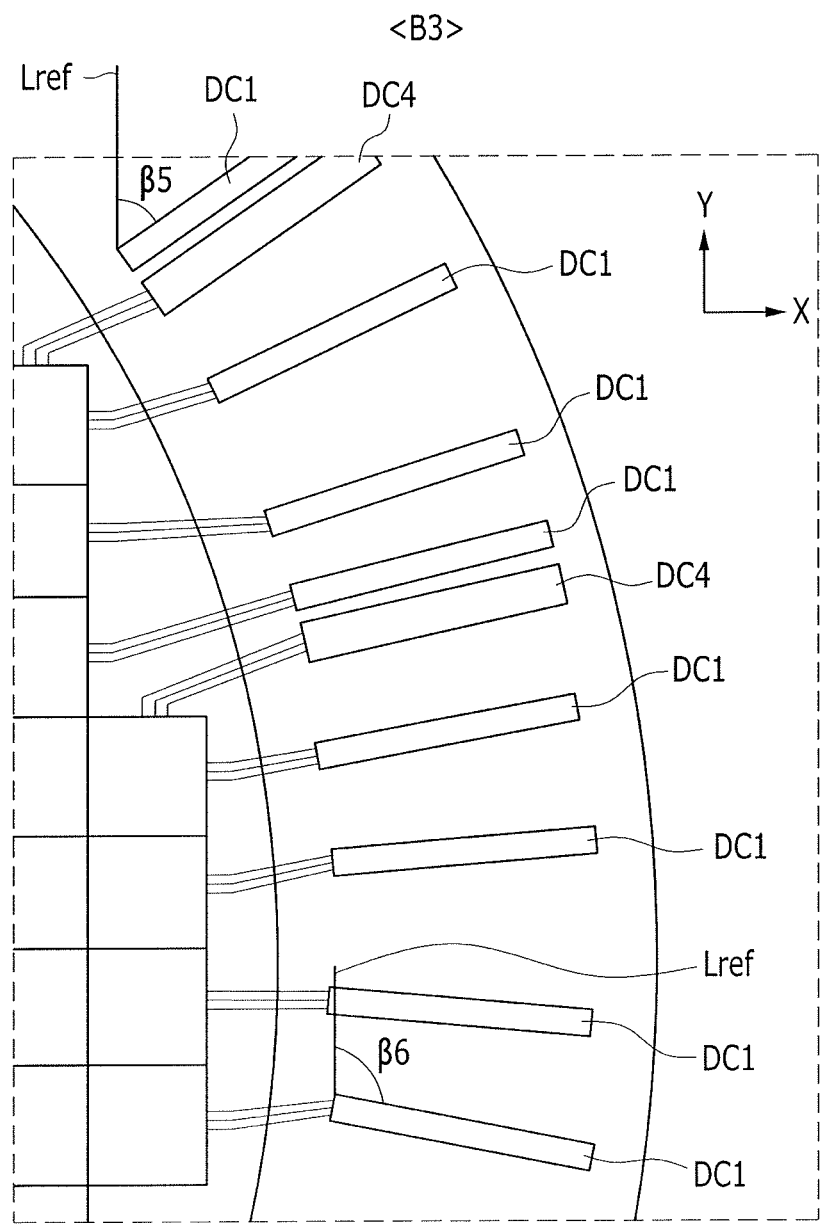
FIG. 11 illustrates an embodiment of a pixel at a third position on an edge of the display panel in FIG. 8 and a driving circuit.

FIG. 11 illustrates an embodiment of a pixel PX at a third position on an edge of the display panel 20 in FIG. 8 and a driving circuit. In FIG. 11, the driving circuit is in the non-display area 40 in a manner similar to FIG. 9. Different types of driving circuits correspond to respective pixel rows or pixel columns. For example, the first driving circuit DC1 corresponds to the pixel row and the fourth driving circuit DC4 corresponds to the pixel column. On the third position, twelve first driving circuits DC1 correspond to the twelve pixel rows and three fourth driving circuits DC4 correspond to the three pixel columns.

The driving circuits DC1 and DC4 may be inclined at an angle with respect to the plane depending on the shape of the display area 30. When the angle inclined in the clockwise direction is measured in FIG. 11, the angle β6 formed when the first driving circuit DC1 provided rightmost is inclined from the reference line (Lref) is greater than the angle β5 formed when the first driving circuit DC1 provided leftmost is inclined from the reference line (Lref).

The driving circuits DC1 and DC4 are arranged in series in the non-display area 40. The types of the driving circuits DC1 and DC4 are changed and arranged in a column along the circumference of the display area 30. For example, in FIG. 11, the driving circuits DC1 and DC4 from the first driving circuit DC4 provided leftmost to the first driving circuit DC1 provided rightmost are arranged in a single column along the circumference of the display area 30 while the types thereof are changed.

When a step occurs between the pixel arrangements, the type of the driving circuit is changed and disposed depending on the type of the corresponding step. When the step is generated between pixel arrangements for respective rows, the first driving circuit DC1 corresponds to the corresponding step. When the step is generated for respective columns, the fourth driving circuit DC4 corresponds to the corresponding step. The first driving circuit DC1 supplies signals to different pixel rows, and the fourth driving circuit DC4 supplies signals to different pixel columns.

One driving circuit supplies a signal to the pixels PX in a row or a column. One pixel PX includes a plurality of subpixels PX11, PX12, and PX13. Thus, one driving circuit supplies the signal to the subpixels PX11, PX12, and PX13 in one pixel row or one pixel column. Therefore, a plurality of signal wires for one driving circuit are formed to supply signals to one pixel row or one pixel column. The signal wires for the driving circuits DC1 and DC4 to supply signals to the pixels PX are formed to not cross each other in the non-display area 40. The signal wires connected to different types of driving circuits are formed to not cross each other in the non-display area 40.

As illustrated in FIGS. 9 to 11, a different number of driving circuits DC1 and DC4 may be disposed depending on their position on the display panel 20. For example, a plurality of fourth driving circuits DC4 are disposed by the step between the pixel arrangements generated for respective columns on the first position. A plurality of first driving circuits DC1 are disposed by the step between the pixel arrangements generated for respective rows on the third position. Thus, the types and numbers of the driving circuits DC1 and DC4 disposed on the circumference of the display area 30 are changed.

Compared to the first exemplary embodiment, the display area 30 is formed to be oval and thus the border of the display area 30 and the non-display area 40 changes in curvature. In one embodiment, the driving circuits DC1 and DC4 are arranged in series on the circumference of the display area 30 and are disposed in a normal direction of the border of the display area 30 and the non-display area 40. As a result, when the curvature is changed, the width of the non-display area 40 is reduced.

Figure 12:
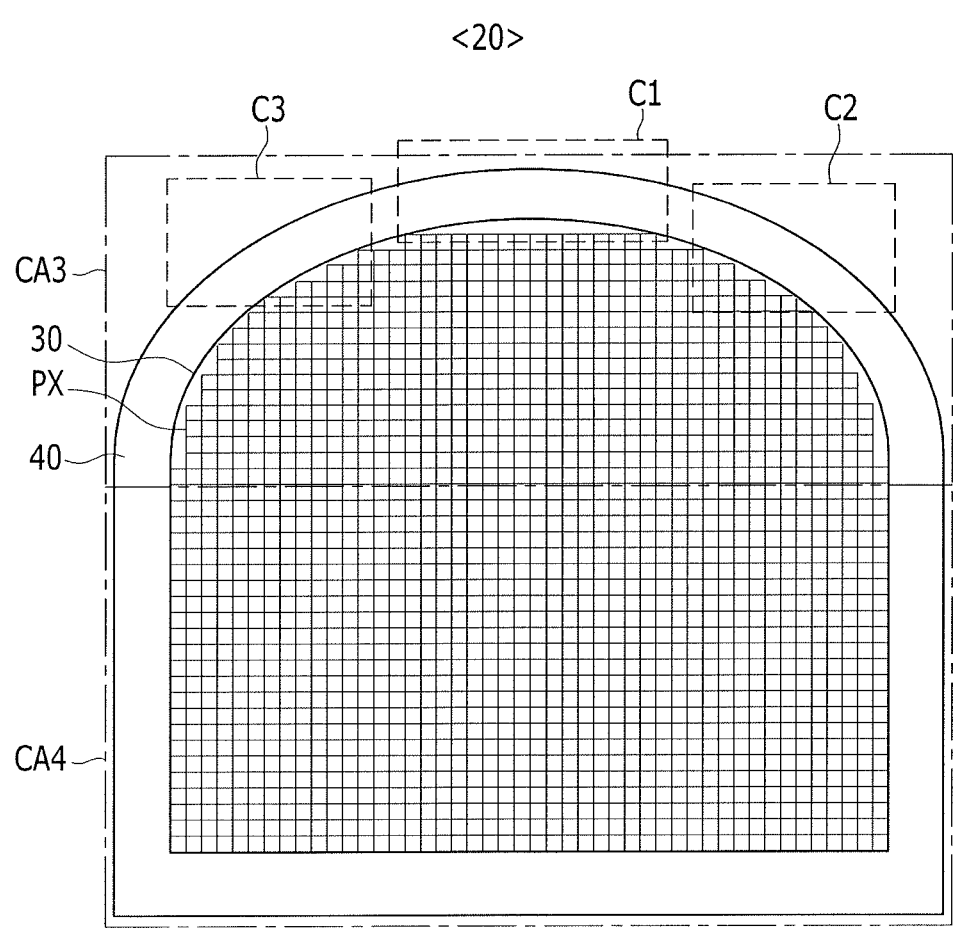
FIG. 12 illustrates another embodiment of a display panel.

FIG. 12 illustrates a third embodiment of a display panel 20 having a curved portion, e.g., the display panel 20 is formed by combining a segmental first region CA3 and a quadrangular second region CA4.

The shape of the display area 30 may be determined corresponding to the shape of the display panel 20. For example, when part of the display panel 20 is curved, the display area 30 corresponding to the part is curved. Therefore, the display area 30 of the first region CA3 is formed to be segmental, and the display area 30 of the second region CA4 is formed to be quadrangular. A non-display area 40 including a driving circuit is formed in a region excluding the display area 30 on the display panel 20.

A plurality of pixels PX are in the display area 30. The pixels PX are in a matrix format in the display area 30. The pixels PX are appropriately disposed corresponding to the curve in the display area 30. For example, when the display area 30 is segmental, a step is generated between the arrangements of pixels on an edge of the segmental display area 30.

For example, a quadrangular pixel PX is disposed on the edge of the display area 30 which is curved so a step is generated between the arrangements of pixels. For example, a step is generated between the pixel arrangement of the first row and the pixel arrangement of the second row by the difference of six pixels PX on the edge of the display area 30 corresponding to the first row and the second row.

The step between pixel arrangements for neighboring respective rows or columns may be different according to the position of the corresponding edge. For example, the step corresponding to the difference of six pixels is generated between the pixel arrangement of the first row and the pixel arrangement of the second row. The step corresponding to the difference of four pixels may be generated between the pixel arrangement of the second row and the pixel arrangement of the third row.

The driving circuit is appropriately formed in the non-display area 40 according to the shape of the display area 30. For example, when the pixels PX are disposed in a segmental form, the driving circuit for supplying signals to the pixels PX is provided along the circumference of the segmental arc on which the pixels PX are disposed. When the display panel 20 is segmental, the shape formed by the display area 30 including the pixels PX and the non-display area 40 including the driving circuit may be segmental.

In FIG. 12, the shapes and sizes of the pixels PX are the same. In another embodiment, the sizes of the pixels PX in two or more regions of the display area 30 may be different. For example, the pixel PX in a second region CA4 of the display area 30 may be larger than the pixel PX on an edge of the first region CA3.

The driving circuits DC1, DC2, and DC4 may be appropriately disposed in the non-display area 40 so that the non-display area 40 occupies a narrow region on the display panel 20. In the case where the display panel 20 on which the pixels PX are arbitrarily disposed, the step occurs between the pixel arrangements. As a result, the driving circuits may be disposed in a manner different from a display panel 20 having a quadrangular arrangement of pixels PX.

Figure 13:
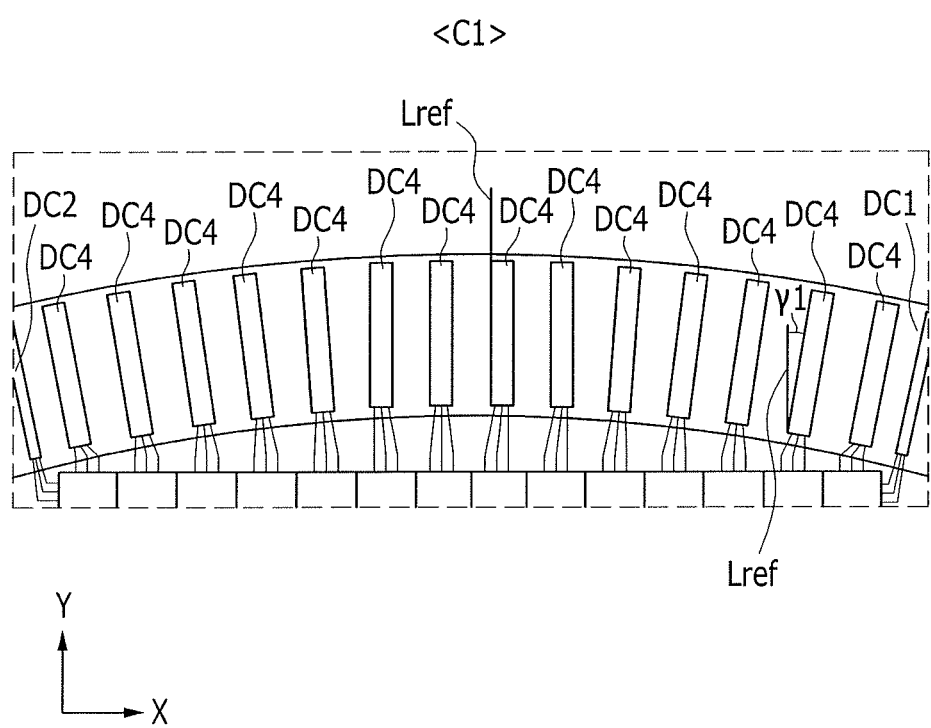
FIG. 13 illustrates an embodiment of a pixel at a first position on an edge in the first region of the display panel in FIG. 12 and a driving circuit.

FIG. 13 illustrates an embodiment of a pixel PX at a first position on an edge in a first region CA3 of the display panel 20 in FIG. 12 and a driving circuit. In FIG. 13, the driving circuit is in the non-display area 40. Also, different types of driving circuits DC1, DC2, and DC4 are disposed at respective positions in the non-display area 40. For example, the non-display area 40 may include a region in which the first driving circuit DC1, the second driving circuit DC2, and the fourth driving circuit DC4 are disposed, a region in which the first driving circuit DC1 and the fourth driving circuit DC4 are disposed, and a region in which the second driving circuit DC2 and the fourth driving circuit DC4 are disposed. Different types and numbers of driving circuits DC1, DC2, and DC4 may be disposed along the circumference of the display area 30 in the non-display area 40.

In this instance, different types of driving circuits DC1, DC2, and DC4 may be disposed for respective pixel rows or pixel columns. For example, the first driving circuit DC1 and the second driving circuit DC2 may correspond to the pixel row and the fourth driving circuit DC4 may correspond to the pixel column. On the first position, one first driving circuit DC1 and one second driving circuit DC2 correspond to one pixel row, and fourteen fourth driving circuits DC4 correspond to fourteen pixel columns.

Respective areas occupied by the different types of driving circuits DC1, DC2, and DC4 may be different. For example, the area of one first driving circuit DC1, the area of one second driving circuit DC2, and the area of one fourth driving circuit DC4 may be different.

Each of the driving circuits DC1, DC2, and DC4 may be inclined at a corresponding angle with respect to a flat surface according to a shape of the display area 30. For example, in the first region CA3, the driving circuits may be inclined at substantially the same angle with a normal angle on a border between the display area 30 and the non-display area 40 and may be disposed in the non-display area 40. When the display area 30 is curved, a normal direction of the border between the display area 30 and the non-display area 40 is changed along the circumference of the display area 30. As a result, a disposal angle of the driving circuits along the circumference of the display area 30 with respect to a reference line (Lref) is changed by the normal direction. The fourth driving circuit DC4 at a center is parallel to the reference line (Lref) in FIG. 13.

In one embodiment, the driving circuits DC1, DC2, and DC4 disposed to the right or the left from the fourth driving circuit DC4 along the circumference of the display area 30 are inclined so that their angles from the reference line (Lref) may be gradually increased or decreased. For example, a disposal angle γ1 of the fourth driving circuit DC4 provided to the right from the reference line (Lref) has a positive value.

In the case of a same type of driving circuit, the disposal angles with respect to the reference line (Lref) are changeable depending on the position of the pixel row or the pixel column. For example, the disposal angles of the fourth driving circuits DC4 corresponding to the different pixel columns may be different from each other.

The driving circuits DC1, DC2, and DC4 are arranged in series to the non-display area 40. The types of the driving circuits DC1, DC2, and DC4 are changed and arranged in a single column along the circumference of the display area 30. For example, in FIG. 13, the driving circuits DC1, DC2, and DC4 from the second driving circuit DC2 provided leftmost to the first driving circuit DC1 provided rightmost are arranged in a single column along the circumference of the display area 30 while the types thereof are changed.

When a step occurs between the pixel arrangements, the type of the driving circuit is changed and disposed depending on the type of the corresponding step. When the step is generated between pixel arrangements for respective rows, the first driving circuit DC1 and the second driving circuit DC2 correspond to the corresponding step. When the step is generated for the respective columns, the fourth driving circuit DC4 corresponds to the corresponding step. The first driving circuit DC1 and the second driving circuit DC2 supply signals to different pixel rows, and the fourth driving circuit DC4 supplies signals to different pixel columns.

In this instance, the first driving circuit DC1 and the second driving circuit DC2 may be disposed in an adjacent region corresponding to the step between the pixel arrangements for the same row. In addition, as shown in FIG. 13, the step of the first pixel row and the second pixel row is generated at the right and the left of the center region. As a result, the first driving circuit DC1 and the second driving circuit DC2 may be disposed corresponding to the right or the left. For example, the second driving circuit DC2 may correspond to the step of the first pixel row and the second pixel row on the left. The first driving circuit DC1 may correspond to the step of the first pixel row and the second pixel row on the right.

One driving circuit supplies the signal to the pixels PX in one row or one column. One pixel PX includes a plurality of subpixels PX11, PX12, and PX13. Thus, one driving circuit supplies signals to the subpixels PX11, PX12, and PX13 in one pixel row or one pixel column. Therefore, a plurality of signal wires are formed for supplying signals to one pixel row or one pixel column by one driving circuit. For example, one first driving circuit DC1 supplies a scan signal to one pixel row. A plurality of pixels PX including an R subpixel, a G subpixel, and a B subpixel are formed in one pixel row. As a result, a scan wire for supplying a scan signal to a plurality of R subpixels, a scan wire for supplying a scan signal to a plurality of G subpixels, and a scan wire for supplying a scan signal to a plurality of B subpixels are formed corresponding to one first driving circuit DC1. This is applicable to other cases, in which the signal wire is connected to different types of driving circuits in like manner.

The signal wires for the driving circuits DC1, DC2, and DC4 to supply signals to the pixels PX are formed to not cross each other in the non-display area 40. The signal wires connected to the different types of driving circuits DC1, DC2, and DC4 are formed to not cross each other in the non-display area 40. For example, the signal wires for connecting neighboring first driving circuit DC1 and the pixel row are formed to not cross the signal wires for connecting the fourth driving circuit DC4 and the pixel column. Therefore, capacitive coupling caused by parasitic capacitor formed by the crossing of the signal wires in the non-display area 40 is reduced.

Figure 14:
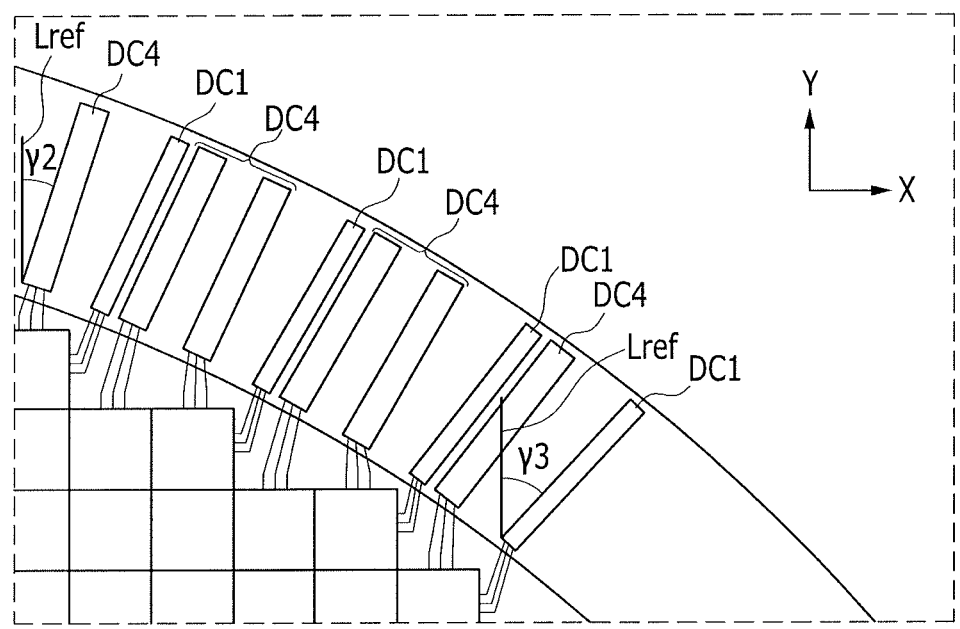
FIG. 14 illustrates an embodiment of a pixel at a second position on an edge in the first region of the display panel in FIG. 12 and a driving circuit.

FIG. 14 illustrates an embodiment of a pixel PX at a second position on an edge in a first region CA3 of the display panel 20 in FIG. 12 and a driving circuit. In FIG. 14, the driving circuits DC1 and DC4 are in the non-display area 40 in a manner similar to FIG. 13. Different types of driving circuits DC1, DC2, and DC4 may be disposed to correspond to respective pixel rows or pixel columns. For example, the first driving circuit DC1 may correspond to the pixel row, and the fourth driving circuit DC4 may correspond to the pixel column. On the second position, four first driving circuits DC1 correspond to the four pixel rows and six fourth driving circuits DC4 correspond to the six pixel columns.

The driving circuits DC1, DC2, and DC4 may be inclined at an angle with respect to the plane depending on the shape of the display area 30. When the angle inclined in a clockwise direction is measured in FIG. 14, the angle formed when the fourth driving circuit DC4 provided rightmost is inclined from the reference line (Lref) is greater than the angle formed when the first driving circuit DC1 provided leftmost is inclined from the reference line (Lref).

The driving circuits DC1, DC2, and DC4 are arranged in series in the non-display area 40. The types of the driving circuits DC1, DC2, and DC4 are changed and arranged in a column along the circumference of the display area 30. For example, in FIG. 14, the driving circuits DC1, DC2, and DC4 from the fourth driving circuit DC4 provided leftmost to the first driving circuit DC1 provided rightmost are arranged in a single column along the circumference of the display area 30 while the types thereof are changed.

When a step occurs between the pixel arrangements, the type of the driving circuit is changed and disposed depending on the type of the corresponding step. When the step is generated between pixel arrangements for respective rows, the first driving circuit DC1 corresponds to the corresponding step. When the step is generated for the respective columns, the fourth driving circuit DC4 corresponds to the corresponding step. The first driving circuit DC1 supplies signals to different pixel rows, and the fourth driving circuit DC4 supplies signals to different pixel columns. Regarding FIG. 14, the step is generated in the row direction and the column direction by one pixel PX, so the first driving circuit DC1 and the fourth driving circuit DC4 are alternately disposed.

One driving circuit supplies a signal to the pixels PX in a row or a column. One pixel PX includes a plurality of subpixels PX11, PX12, and PX13. As a result, one driving circuit supplies the signal to the subpixels PX11, PX12, and PX13 in one pixel row or one pixel column. Therefore, a plurality of signal wires for one driving circuit are formed to supply signals to one pixel row or one pixel column. The signal wires for the driving circuits DC1, DC2, and DC4 that supply signals to the pixels PX are formed to not cross each other in the non-display area 40. The signal wires connected to different types of driving circuits DC1, DC2, and DC4 are formed to not cross each other in the non-display area 40.

Figure 15:
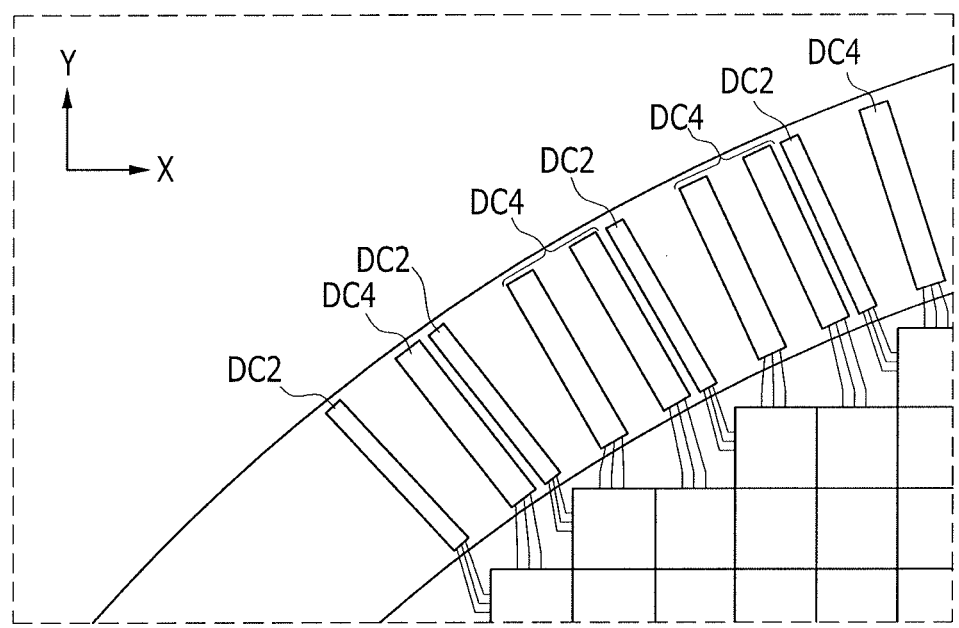
FIG. 15 illustrates an embodiment of a pixel at a third position on an edge in the first region of the display panel in FIG. 12 and a driving circuit.

FIG. 15 illustrates an embodiment of a pixel PX at a third position on an edge in a first region CA3 of the display panel 20 in FIG. 12 and a driving circuit. In FIG. 15, the driving circuit is in the non-display area 40 in a manner similar to FIG. 13. Different types of driving circuits DC1, DC2, and DC4 may correspond to respective pixel rows or pixel columns. For example, the second driving circuit DC2 may correspond to the pixel row, and the fourth driving circuit DC4 may correspond to the pixel column. On the third position, four second driving circuits DC2 correspond to the four pixel rows and six fourth driving circuits DC4 correspond to the six pixel columns.

The third position is symmetrical with respect to the second position and the center region of the display area 30. The first driving circuit DC1 and the fourth driving circuit DC4 are in the non-display area 40 of the second position, but the second driving circuit DC2 and the fourth driving circuit DC4 are in the non-display area 40 of the third position.

The driving circuits DC1, DC2, and DC4 are inclined at an angle with respect to the plane depending on the shape of the display area 30. When the angle inclined in the clockwise direction from the reference line (Lref) is measured in FIG. 15, the angle formed when the fourth driving circuit DC4 provided rightmost is inclined from the reference line (Lref) is greater than the angle formed when the second driving circuit DC2 provided leftmost is inclined from the reference line (Lref).

The driving circuits DC1, DC2, and DC4 are arranged in series in the non-display area 40. The types of the driving circuits DC1, DC2, and DC4 are changed and arranged in a column along the circumference of the display area 30. For example, in FIG. 15, the driving circuits DC1, DC2, and DC4 from the second driving circuit DC2 provided leftmost to the fourth driving circuit DC4 provided rightmost are arranged in a single column along the circumference of the display area 30 while the types thereof are changed.

When a step occurs between the pixel arrangements, the type of the driving circuit is changed and disposed depending on the type of the corresponding step. When the step is generated between pixel arrangements for the respective rows, the second driving circuit DC2 corresponds to the corresponding step. When the step is generated for the respective columns, the fourth driving circuit DC4 corresponds to the corresponding step. The second driving circuit DC2 supplies signals to different pixel rows, and the fourth driving circuit DC4 supplies signals to different pixel columns.

One driving circuit supplies a signal to the pixels PX in a row or a column. One pixel PX includes a plurality of subpixels PX11, PX12, and PX13. Thus, one driving circuit supplies the signal to the subpixels PX11, PX12, and PX13 in one pixel row or one pixel column. Therefore, a plurality of signal wires for one driving circuit are formed to supply signals to one pixel row or one pixel column. The signal wires for the driving circuits DC1, DC2, and DC4 to supply signals to the pixels PX are formed to not cross each other in the non-display area 40. The signal wires connected to different types of driving circuits DC1, DC2, and DC4 are formed to not cross each other in the non-display area 40.

As illustrated in FIGS. 13 to 15, a different number of driving circuits DC1, DC2, and DC4 may be disposed depending on their position on the display panel 20. For example, a plurality of fourth driving circuits DC4 are disposed by the step between the pixel arrangements generated for respective columns on the first position, a plurality of first driving circuits DC1 are disposed by the step between the pixel arrangements generated for respective rows on the second position, and a plurality of second driving circuits DC2 are disposed by the step between the pixel arrangements generated for respective rows on the third position. Thus, the types and numbers of the driving circuits DC1, DC2, and DC4 on the circumference of the display area 30 are changed.

Compared to the first exemplary embodiment and the second exemplary embodiment, part of the display area 30 is formed to be segmental and thus the curvature of the border of the display area 30 and the non-display area 40 changes. In one exemplary embodiment, the driving circuits DC1, DC2, and DC4 are arranged in series on the circumference of the display area 30 and are disposed in a normal direction of the border of the display area 30 and the non-display area 40. As a result, when the curvature is changed, the width of the non-display area 40 is reduced.

Figure 16:
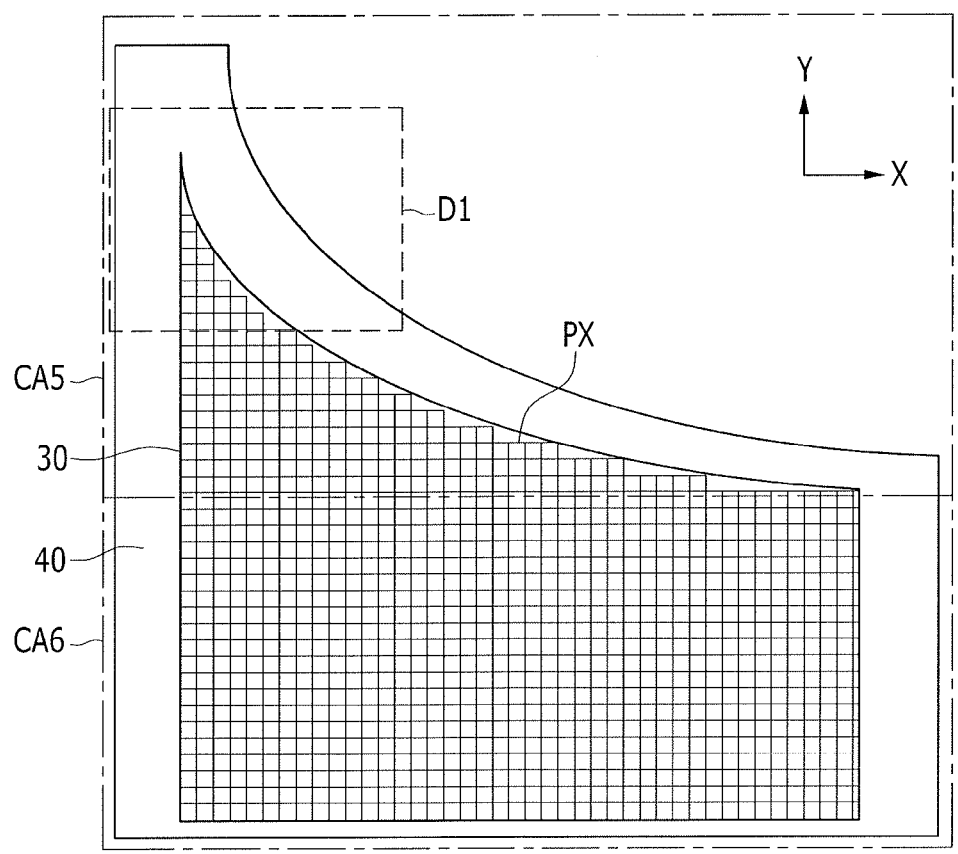
FIG. 16 illustrates another embodiment of a display panel.

FIG. 16 illustrates a fourth embodiment of a display panel 20 which has at least one curved portion. In FIG. 16, the display panel 20 is formed by combining a concave and curved first region CA5 and a quadrangular second region CA6.

The shape of the display area 30 may be determined corresponding to the shape of the display panel 20. For example, when part of the display panel 20 is curved, the display area 30 corresponding to the part is curved. Therefore, the display area 30 of the first region CA5 is formed to be concave and curved, and the display area 30 of the second region CA6 is formed to be quadrangular. A non-display area 40 including a driving circuit is formed in a region excluding the display area 30 on display panel 20.

A plurality of pixels PX are in the display area 30. The pixels PX may be disposed in a matrix format in the display area 30. The pixels PX are appropriately disposed to correspond to the curve in the display area 30. For example, when the display area 30 is concave and curved, a step is generated between the arrangements of pixels on an edge of the concave and curved display area 30.

For example, a quadrangular pixel PX is disposed on the curved edge of the display area 30 so that the step is generated between the arrangements of pixels. For example, a step is generated between the pixel arrangement of the first column and the pixel arrangement of the second column by the difference of two pixels PX on the edge of display area 30 corresponding to the first column and the second column from the left.

The step between the pixel arrangements for neighboring rows or columns may be different according to the position of the corresponding edge. For example, the step caused by the difference of two pixels is generated between the pixel arrangement of the first column and the pixel arrangement of the second column. The step caused by the difference of one pixel may be generated between the pixel arrangement of the third column and the pixel arrangement of the fourth column.

The driving circuit is appropriately formed in the non-display area 40 according to the shape of the display area 30. For example, when the pixels PX are in a concave and curved form, the driving circuit for supplying signals to the pixels PX is provided along the concave curve on which the pixels PX are disposed.

In FIG. 16, the shapes and sizes of the pixels PX are the same. In another embodiment, the sizes of the pixels PX in two or more regions of the display area 30 may be different.

For example, the pixel PX in a second region CA6 of the display area 30 may be larger than the pixel PX on an edge of the first region CA5.

The driving circuits DC1, DC2, and DC4 may be appropriately disposed in the non-display area 40 so that the non-display area 40 occupies a narrow region on the display panel 20. When the pixels PX are arbitrarily disposed in the display panel 20, the step occurs between the pixel arrangements so the driving circuits are disposed in a way that is different from pixels disposed in a quadrangular manner.

Figure 17:
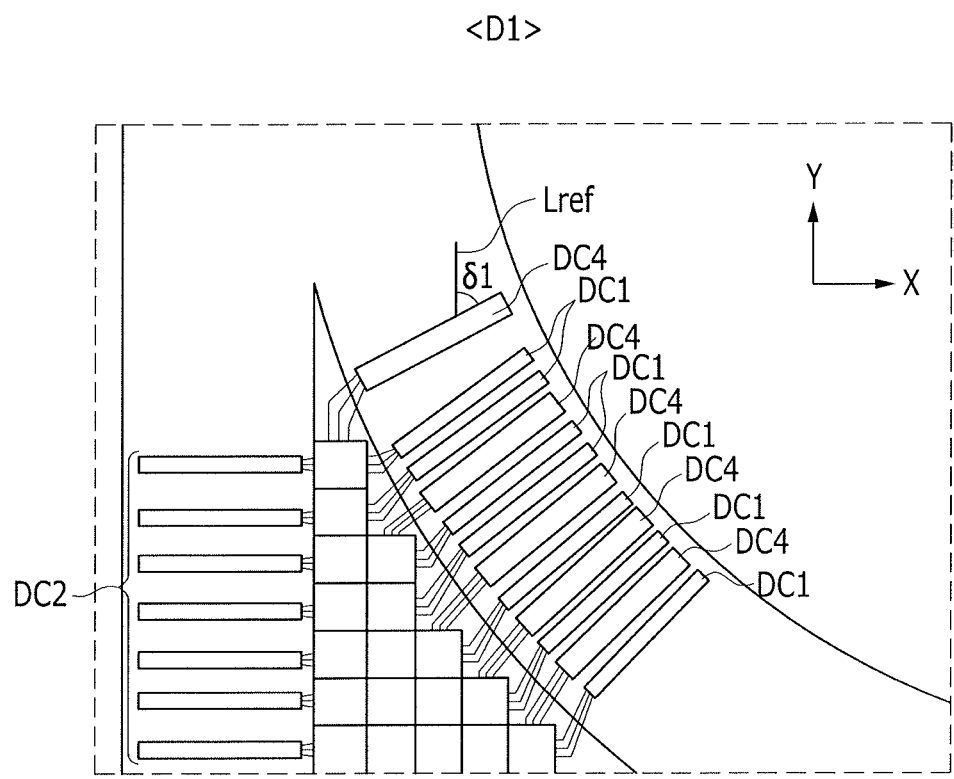
FIG. 17 illustrates an embodiment of a pixel in a first region on the display panel in FIG. 16 and a driving circuit.

FIG. 17 illustrates an embodiment of a pixel PX at a first position D1 in a first region CA5 on the display panel 20 in FIG. 16 and a driving circuit. As shown, the driving circuit is in the non-display area 40. Different types of driving circuits DC1, DC2, and DC4 may be disposed at the respective positions in the non-display area 40. For example, the non-display area 40 may include a region in which the first driving circuit DC1 and the fourth driving circuit DC4 are disposed, a region in which the second driving circuit DC2 is disposed, and a region in which the third driving circuit is disposed. Different types and numbers of driving circuits DC1, DC2, and DC4 may be disposed along the circumference of the display area 30 in the non-display area 40.

In this instance, different types of driving circuits DC1, DC2, and DC4 may be disposed for respective pixel rows or pixel columns. For example, the first driving circuit DC1 and the second driving circuit DC2 may correspond to the pixel row, and the fourth driving circuit DC4 may correspond to the pixel column. In the first region CA5, seven first driving circuits DC1 and seven second driving circuits DC2 correspond to seven pixel rows and five fourth driving circuits DC4 correspond to five pixel columns.

The areas occupied by the different types of driving circuits DC1, DC2, and DC4 may be different. For example, the area of one first driving circuit DC1, the area of one second driving circuit DC2, and the area of one fourth driving circuit DC4 may be different.

The driving circuits DC1, DC2, and DC4 may be inclined at a corresponding angle with respect to a flat surface according to a shape of the display area 30. For example, in the first region CA5, the driving circuits may be inclined at substantially the same angle as a normal angle on a border between the display area 30 and the non-display area 40 and may be disposed in the non-display area 40. When the display area 30 is curved, a normal direction of the border between the display area 30 and the non-display area 40 is changed along the circumference of the curved display area 30. As a result, a disposal angle of the driving circuits along the circumference of the display area 30 with respect to a reference line (Lref) is changed by the normal direction.

The second driving circuit DC2 provided on the left of the display area 30 in FIG. 17 is disposed to be orthogonal to a straight line, since the shape of its corresponding display area 30 is a straight line. The driving circuits DC1, DC2, and DC4 disposed to the right from the fourth driving circuit DC4 connected to the leftmost pixel column of the display area 30 along the circumference of the display area 30 are disposed to be inclined so that the angle from the reference line (Lref) may be gradually reduced. For example, the disposal angle $\delta 1$ of the fourth driving circuit DC4 connected to the leftmost pixel column from the reference line (Lref) has a positive value.

In the case of a same type of driving circuit, the disposal angles with respect to the reference line (Lref) are changeable depending on the position of the pixel row or the pixel column. For example, the disposal angles of the fourth driving circuits DC4 corresponding to the different pixel columns may be different from each other.

The driving circuits DC1, DC2, and DC4 are arranged in series in the non-display area 40. The types of the driving circuits DC1, DC2, and DC4 are changed and arranged in a single column along the circumference of the display area 30. For example, in FIG. 17, corresponding to the curved display area 30, the driving circuits DC1, DC2, and DC4 from the fourth driving circuit DC4 provided leftmost to the first driving circuit DC1 provided rightmost are arranged in a single column along the circumference of the display area 30 while the types thereof are changed.

When a step occurs between the pixel arrangements, the type of the driving circuit is changed and disposed depending on the type of the corresponding step. When the step is generated between the pixel arrangements for respective rows, the first driving circuit DC1 and the second driving circuit DC2 correspond to the corresponding step. When the step is generated for the respective columns, the fourth driving circuit DC4 corresponds to the corresponding step. The first driving circuit DC1 and the second driving circuit DC2 supply signals to different pixel rows, and the fourth driving circuit DC4 supplies signals to different pixel columns.

One driving circuit supplies the signal to the pixels PX in one row or one column. One pixel PX includes a plurality of subpixels PX11, PX12, and PX13. Thus, one driving circuit supplies signals to the subpixels PX11, PX12, and PX13 in one pixel row or one pixel column. Therefore, a plurality of signal wires are formed for supplying signals to one pixel row or one pixel column by one driving circuit. For example, one first driving circuit DC1 supplies a scan signal to one pixel row. A plurality of pixels PX including an R subpixel, a G subpixel, and a B subpixel are formed in one pixel row. Therefore, a scan wire for supplying a scan signal to a plurality of R subpixels, a scan wire for supplying a scan signal to a plurality of G subpixels, and a scan wire for supplying a scan signal to a plurality of B subpixels are formed corresponding to one first driving circuit DC1. This is applicable to other cases in which the signal wire is connected to different types of driving circuits in a like manner.

The signal wires for the driving circuits DC1, DC2, and DC4 to supply signals to the pixels PX are formed to not cross each other in the non-display area 40. The signal wires connected to the different types of driving circuits DC1, DC2, and DC4 are formed to not cross each other in the non-display area 40. For example, the signal wires for connecting the neighboring first driving circuit DC1 and the pixel row are formed to not cross the signal wires for connecting the fourth driving circuit DC4 and the pixel column. Therefore, capacitive coupling caused by parasitic capacitor formed by the crossing of the signal wires in the non-display area 40 is reduced.

In accordance with one or more of the aforementioned embodiments, the driving circuits supply different types of driving signals (e.g., scan signal, data signal, emission control signal, and/or test voltage) to the display panel 20 with an arbitrary shape and that the pixels are in the display area 30 of the display panel 20.

The aforementioned embodiments may be applied to other kinds of non-quadrangular displays. In embodiments including the first driving circuit DC1, the second driving circuit DC2, and the fourth driving circuit DC4, the fourth driving circuit DC4 is exchangeable with the third driving circuit, which is a relative position on the display panel 20.

The driving circuits may have different densities in the non-display area 40, for example, depending on the disposed shape of the pixels. Further, the driving circuits are in series in the non-display area. Therefore, the width of the non-display area 40 may be reduced. Also, the signal wires for the driving circuits to supply signals to the display area do not overlap each other, thereby reducing parasitic capacitance that otherwise might occur when the wires overlap each other.

Also, in one embodiment, the display panel may include a partial convex curve and a partial concave curve In this case, the driving circuits may be appropriately disposed by combining the above-described exemplary embodiments.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. A non-quadrangular display, comprising:
   a plurality of pixels in a non-quadrangular display area, each of the pixels connected to a first signal line in a first direction and a second signal line in a second direction crossing the first direction;
   a plurality of first driving circuits in a peripheral area of the display area, each of the first driving circuits to output a first signal to the first signal line of a corresponding one of the pixels; and
   a plurality of second driving circuits in the peripheral area, each of the second driving circuits to output a second signal to the second signal line of a corresponding one of the pixels, wherein a first number of the second driving circuits is between a first pair of neighboring first driving circuits at a first position in the peripheral area, a second number of the second driving circuits is between a second pair of neighboring first driving circuits at a second position in the peripheral area, and a third number of the second driving circuits is between a third pair of neighboring first driving circuits at a third position in the peripheral area, and wherein the first number, the second number, and the third number are different from each other, and the first, second, and third numbers are not zero.

2. The display as claimed in claim 1, wherein the first driving circuits and the second driving circuits are adjacent a circumference of the display area.

3. The display as claimed in claim 2, wherein angles for arranging the first driving circuits and the second driving circuits are changed according to positions of the first driving circuits and the second driving circuits.

4. The display as claimed in claim 3, wherein the angles are changed equally to normal directions of the circumference of the display area which is corresponding to the positions of each of the first driving circuits and the second driving circuits.

5. The display as claimed in claim 4, wherein an area of the first driving circuit for at least one pixel is different from an area of the second driving circuit for at least one pixel.

6. The display as claimed in claim 5, wherein a sum of widths of areas of the first driving circuits and the second driving circuits alternately disposed and adjacently provided in a tangential direction is less than half the width of the pixel.

7. The display as claimed in claim 1, wherein:
the display area includes a curved area, and
the pixels are arranged in a matrix form in the curved area.

8. The display as claimed in claim 7, wherein:
when a step is between neighboring arrangements of the pixels, the first driving circuit or the second driving circuit in the peripheral area corresponds to the step according to a type of the step.

9. The display as claimed in claim 1, wherein:
the pixels include a plurality of subpixels,
the subpixels emit different colors of light, and
the subpixels are to be controlled by second signals transmitted through the second signal lines in synchronization with first signals transmitted through the first signal lines.

10. The display as claimed in claim 9, wherein the subpixels include:
a plurality of switching transistors, each of the switching transistors including a first electrode connected to a respective one of the second signal lines and the first signal lines as gate electrodes; and
a plurality of driving transistors, each of the driving transistors including a gate electrode connected to a second electrode of a respective one of the switching transistors, a first electrode to receive a power voltage, and a second electrode connected to an organic light emitting diode.

11. The display as claimed in claim 10, wherein each of the subpixels receives an initialization voltage in synchronization with first signals transmitted through respective first signal lines corresponding to a previous pixel row.

12. The display as claimed in claim 11, wherein each of the subpixels includes a compensation transistor connected between the gate electrode and the second electrodes of the driving transistors, the gate electrode included as part of a corresponding first signal line.

13. The display as claimed in claim 1, wherein the first signal lines and the second signal lines of the pixels do not cross each other in the peripheral area.

14. The display as claimed in claim 1, wherein:
each the pixels is connected to a third signal line in the first direction, and
the display includes a plurality of third driving circuits alternately disposed with at least one of the second driving circuits, each of the third driving circuits to output a third signal to a third signal line of at least one of the pixels.

15. A non-quadrangular display, comprising:
a display area including a curved portion, the display area including a plurality of pixels disposed so that steps in a row direction and a column direction correspond to the curved portion; and
a non-display area including first driving circuits to supply a first signal to respective pixels in the row direction and second driving circuits to supply a second signal to respective pixels in the column direction, wherein a first number of the second driving circuits is between a first pair of neighboring first driving circuits at a first position at the circumference of the display area, a second number of the second driving circuits is between a second pair of neighboring first driving circuits at the circumference of the display area, and a third number of the second driving circuits is between a third pair of neighboring first driving circuits at the circumference of the display area, and wherein the first number, the second number, and the third number are different from each other and the first, second, and third numbers are not zero.

16. The display as claimed in claim 15, wherein at least one of the first driving circuits is provided in substantially a normal direction in which the pixels have steps in the row direction.

17. The display as claimed in claim 15, wherein at least one of the second driving circuits is provided in substantially a normal direction in which the pixels have steps in the column direction.

18. The display as claimed in claim 15, wherein the non-display area has a predetermined width along a circumference of the display area.

19. The display as claimed in claim 18, wherein each of the first driving circuit and the second driving circuit has substantially rectangular shape and substantially a same length of a long side.

20. The display as claimed in claim 19, wherein a width of the non-display area is greater than the length of the long side and less than a sum of both long side lengths of the substantially rectangular shape.

* * * * *